(12) United States Patent
Oh et al.

(10) Patent No.: US 10,971,487 B2
(45) Date of Patent: *Apr. 6, 2021

(54) SEMICONDUCTOR MEMORY DEVICE

(71) Applicant: SK hynix Inc., Gyeonggi-do (KR)

(72) Inventors: Sung-Lae Oh, Chungcheongbuk-do (KR); Dong-Hyuk Kim, Seoul (KR); Soo-Nam Jung, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/829,918

(22) Filed: Mar. 25, 2020

(65) Prior Publication Data

US 2020/0227398 A1 Jul. 16, 2020

Related U.S. Application Data

(63) Continuation-in-part of application No. 16/132,762, filed on Sep. 17, 2018, now Pat. No. 10,643,704.

(30) Foreign Application Priority Data

May 28, 2018 (KR) ........................ 10-2018-0060086

(51) Int. Cl.
| | |
|---|---|
| *G11C 8/00* | (2006.01) |
| *H01L 25/18* | (2006.01) |
| *H01L 27/11556* | (2017.01) |
| *H01L 27/11526* | (2017.01) |
| *H01L 23/00* | (2006.01) |
| *G11C 16/08* | (2006.01) |
| *H01L 27/11582* | (2017.01) |
| *G11C 16/04* | (2006.01) |

(Continued)

(52) U.S. Cl.
CPC .......... *H01L 25/18* (2013.01); *G11C 16/0483* (2013.01); *G11C 16/08* (2013.01); *H01L 24/08* (2013.01); *H01L 27/11526* (2013.01); *H01L 27/11548* (2013.01); *H01L 27/11556* (2013.01); *H01L 27/11573* (2013.01); *H01L 27/11575* (2013.01); *H01L 27/11582* (2013.01); *H01L 2224/08145* (2013.01); *H01L 2924/1431* (2013.01); *H01L 2924/14511* (2013.01)

(58) Field of Classification Search
CPC ...... G11C 16/08; G11C 16/04; G11C 16/0483
USPC .................................................... 365/230.06
See application file for complete search history.

(56) References Cited

U.S. PATENT DOCUMENTS

| 10,643,704 B2* | 5/2020 | Oh ..................... H01L 27/11565 |
| 2009/0196102 A1* | 8/2009 | Kim ......................... G11C 8/08 |
| | | 365/185.11 |

(Continued)

*Primary Examiner* — Hoai V Ho
(74) *Attorney, Agent, or Firm* — IP & T Group LLP

(57) ABSTRACT

A semiconductor memory device includes a cell wafer including a first plane and a second plane which are disposed to be adjacent to each other in a first direction and each include a plurality of memory cells; and a peripheral wafer including a row decoder which simultaneously controls the first and second planes and first and second page buffer circuits which control the first and second planes, respectively. The cell wafer includes, on one surface thereof bonded to the peripheral wafer, a first pad which is coupled in common with the first plane and the second plane, and the peripheral wafer includes, on one surface thereof bonded to the cell wafer, a second pad which is coupled with the row decoder and is bonded to the first pad.

20 Claims, 23 Drawing Sheets

(51) Int. Cl.
*H01L 27/11548* (2017.01)
*H01L 27/11575* (2017.01)
*H01L 27/11573* (2017.01)

(56) References Cited

U.S. PATENT DOCUMENTS

2017/0278850 A1* 9/2017 Madurawe ............. G11C 5/063
2017/0330624 A1* 11/2017 Lim ....................... G11C 5/025

* cited by examiner

*FIG.14*

|  | Plane1 | Plane2 | Plane3 | Plane4 |
|---|---|---|---|---|
| Plane1 | ✕ | 32KB | 16KB | 16KB |
| Plane2 | 32KB | ✕ | 16KB | 16KB |
| Plane3 | 16KB | 16KB | ✕ | 32KB |
| Plane4 | 16KB | 16KB | 32KB | ✕ |

SEMICONDUCTOR MEMORY DEVICE

CROSS-REFERENCE TO RELATED APPLICATION

The present application is a Continuation-In-Part of U.S. application Ser. No. 16/132,762 filed on Sep. 17, 2018, which claims priority under 35 USC § 119 to Korean Patent Application No. 10-2018-0060086 filed on May 28, 2018, in the Korean Intellectual Property Office, the disclosures of which are incorporated herein in their entirety by reference.

BACKGROUND

1. Technical Field

Various embodiments of the present invention generally relate to a semiconductor memory device. Particularly, the embodiments relate to a semiconductor memory device including a plurality of planes.

2. Related Art

A semiconductor memory device is a memory device which is implemented using a semiconductor such as silicon (Si), germanium (Ge), gallium arsenide (GaAs) and indium phosphide (InP), and is generally divided into a volatile memory device and a nonvolatile memory device.

A volatile memory device is a memory device in which stored data is lost when power supply is interrupted. Examples of the volatile memory device includes an SRAM (static random access memory), a DRAM (dynamic RAM), and an SDRAM (synchronous DRAM). A nonvolatile memory device is a memory device which retains data stored therein even when power supply is interrupted. Examples of the nonvolatile memory device includes a ROM (read only memory), a PROM (programmable ROM), an EPROM (electrically programmable ROM), an EEPROM (electrically erasable and programmable ROM), a FLASH memory, a PCRAM (phase change RAM), an MRAM (magnetic RAM), an RRAM (resistive RAM), and an FRAM (ferroelectric RAM).

SUMMARY

In an embodiment, a semiconductor memory device may include a cell wafer including first and second planes which are disposed to be adjacent to each other in a first direction and each include a plurality of memory cells, and having, on one surface thereof, a first pad which is coupled in common to the first plane and the second plane; and a peripheral wafer including a peripheral circuit, and having, on one surface thereof bonded to the one surface of the cell wafer, a second pad which is coupled with the peripheral circuit and is bonded to the first pad. The peripheral circuit includes a pass transistor circuit which is coupled with the second pad and a block switch circuit which controls the pass transistor circuit. The block switch circuit is disposed in a first plane region of the peripheral wafer, which overlaps with the first plane in a vertical direction orthogonal to the one surface, and a second plane region of the peripheral wafer, which overlaps with the second plane in the vertical direction. The pass transistor circuit is disposed in an interval region of the peripheral wafer between the first plane region and the second plane region.

In an embodiment, a semiconductor memory device may include a cell wafer including a first plane and a second plane which are disposed to be adjacent to each other in a first direction and each include a plurality of memory cells; and a peripheral wafer including a row decoder which simultaneously controls the first and second planes and first and second page buffer circuits which control the first and second planes, respectively. The cell wafer includes, on one surface thereof bonded to the peripheral wafer, a first pad which is coupled in common with the first plane and the second plane, and the peripheral wafer includes, on one surface thereof bonded to the cell wafer, a second pad which is coupled with the row decoder and is bonded to the first pad.

BRIEF DESCRIPTION OF THE DRAWINGS

FIG. 14 is an example of a table describing the data processing operation of the semiconductor memory device shown in FIG. 12.

DETAILED DESCRIPTION

Figure 1:
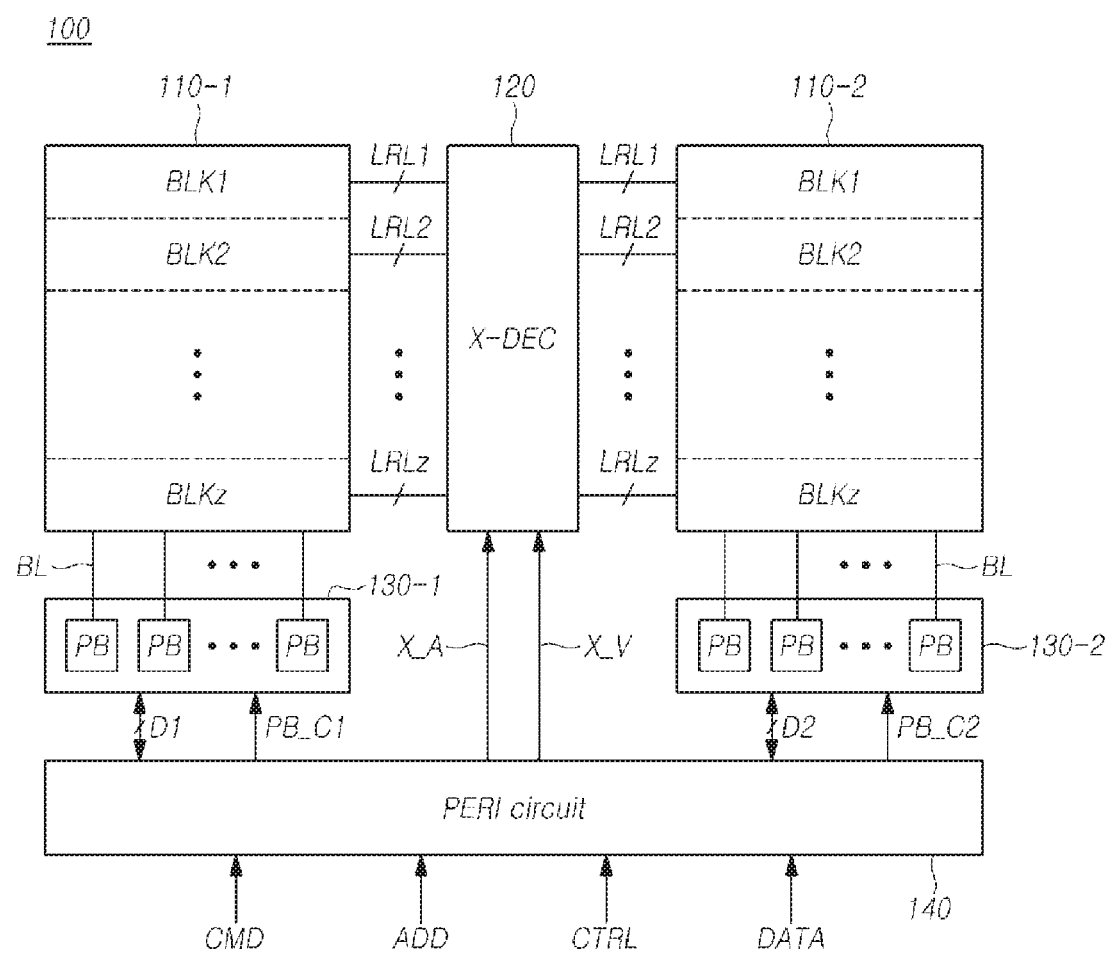
FIG. 1 is a block diagram illustrating a semiconductor memory device in accordance with an embodiment.

Various embodiments of the present invention are described below in more detail with reference to the accompanying drawings. We note, however, that the present invention may be embodied in different forms and variations, and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention. It is noted that reference to "an embodiment" does not necessarily mean only one embodiment, and different references to "an embodiment" are not necessarily to the same embodiment(s).

The drawings are not necessarily to scale and, in some instances, proportions may have been exaggerated in order to clearly illustrate features of the embodiments.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention.

As used herein, singular forms may include the plural forms as well and vice versa, unless the context clearly indicates otherwise.

Hereinafter, a semiconductor memory device will be described below with reference to the accompanying drawings through various examples of embodiments.

FIG. 1 is a block diagram illustrating a semiconductor memory device 100 in accordance with an embodiment.

Referring to FIG. 1, the semiconductor memory device 100 in accordance with an embodiment may include first and second planes 110-1 and 110-2, a row decoder 120, first and second page buffer circuits 130-1 and 130-2 and a peripheral circuit 140.

Each of the first and second planes 110-1 and 110-2 may include a plurality of memory cells which have states corresponding to the data stored therein. The memory cells may be accessed by word lines and bit lines. The memory cells may be volatile memory cells which lose data stored therein when the power supply is interrupted, or may be nonvolatile memory cells which retain data stored therein even when the power supply is interrupted.

While it is described below that the semiconductor memory device 100 is a vertical NAND flash device, it is to be understood that the present invention is not limited thereto.

Each of the first plane 110-1 and the second plane 110-2 may include a plurality of memory blocks BLK1 to BLKz (z is a natural number of 2 or more). While not shown, each of the memory blocks BLK1 to BLKz may include a plurality of cell strings. Each of the plurality of cell strings may include at least one drain select transistor, a plurality of memory cells and at east one source select transistor which are coupled in series.

The first plane 110-1 and the second plane 110-2 may be coupled in common to the row decoder 120 through local row lines LRL1 to LRLz. An i-th (i is a natural number of z or less) memory block BLKi included in the first plane 110-1 and an i-th memory block BLKi included in the second plane 110-2 may be coupled in common to the row decoder 120 through local row lines LRLi. The i-th memory block BLKi may correspond to any one memory block among the plurality of memory blocks BLK1 to BLKz of the first plane 110-1 and the second plane 110-2. The local row lines LRLi may include one or more local drain select lines, a plurality of local word lines and one or more local source select lines.

The first plane 110-1 may be coupled to the first page buffer circuit 130-1 through bit lines BL. The second plane 110-2 may be coupled to the second page buffer circuit 130-2 through bit lines BL.

The first plane 110-1 and the second plane 110-2 may be controlled independently of each other in their operations (for example, program operations and read operations) through the first page buffer circuit 130-1 and the second page buffer circuit 130-2. By being controlled independently of each other in this way, the first plane 110-1 and the second plane 110-2 may perform specific operations in parallel or individually. For example, when the size of one page of each of the first plane 110-1 and the second plane 110-2 is 16 KB, the first and second planes 110-1 and 110-2 may operate in parallel and process data of 32 KB, or only one of the first and second planes 110-1 and 110-2 may operate and process data of 16 KB.

The row decoder 120 may simultaneously control the first plane 110-1 and the second plane 110-2. The row decoder 120 may receive a row address X_A and an operating voltage X_V from the peripheral circuit 140. The row decoder 120 may simultaneously select one of the memory blocks BLK1 to BLKz included in the first plane 110-1 and one of the memory blocks BLK1 to BLKz included in the second plane 110-2, in response to the row address X_A. The row decoder 120 may transfer the operating voltage X_V provided from the peripheral circuit 140, to the local row lines coupled to selected memory blocks.

The row decoder 120 may be shared by the first plane 110-1 and the second plane 110-2. According to the embodiment, since two planes 110-1 and 110-2 share one row decoder 120, the number and occupied area of row decoders may be decreased, and thereby, the degree of integration may be improved.

The first and second page buffer circuits 130-1 and 130-2 may be coupled to the first and second planes 110-1 and 110-2 corresponding thereto, respectively, through the bit lines BL. For example, the first page buffer circuit 130-1 may be coupled to the first plane 110-1. The second page buffer circuit 130-2 may be coupled to the second plane 110-2. Each of the first and second page buffer circuits 130-1 and 130-2 may include a plurality of page buffers PB which are coupled to the bit lines BL.

The first page buffer circuit 130-1 may receive a first page buffer control signal PB_C1 from the peripheral circuit 140, and may transmit and receive a data signal D1 to and from the peripheral circuit 140. The second page buffer circuit 130-2 may receive a second page buffer control signal PB_C2 from the peripheral circuit 140, and may transmit and receive a data signal D2 to and from the peripheral circuit 140.

The first page buffer circuit 130-1 may control the bit lines BL arranged in the first plane 110-1, in response to the first page buffer control signal PB_C1. For example, the first page buffer circuit 130-1 may detect the data stored in a memory cell of the first plane 110-1 by detecting the signal of a bit line BL of the first plane 110-1 in response to the first page buffer control signal PB_C1, and may transmit the data signal D1 to the peripheral circuit 140 depending on the detected data. The first page buffer circuit 130-1 may apply a signal to a bit line BL based on the data signal D1 received from the peripheral circuit 140 in response to the first page buffer control signal PB_C1, and thereby, may write data in a memory cell of the first plane 110-1. The first page buffer circuit 130-1 may write data in or read data from a memory cell coupled to a word line which is activated by the row decoder 120. The second page buffer circuit 130-2 may also operate in a manner similar to the first page buffer circuit 130-1.

The peripheral circuit 140 may receive a command signal CMD, an address signal ADD, and a control signal CTRL from outside the semiconductor memory device 100, and may transmit and receive data DATA to and from a device outside the semiconductor memory device 100, for example, a memory controller. The peripheral circuit 140 may output signals (for example, the row address X_A, the first and second page buffer control signals PB_C1 and PB_C2, and so forth) for writing data in the first and second planes 110-1 and 110-2 or reading data from the first and second planes 110-1 and 110-2 based on the command signal CMD, the address signal ADD, and the control signal CTRL. The peripheral circuit 140 may generate various voltages including the operating voltage X_V, which are required in the semiconductor memory device 100.

Hereinbelow, in the accompanying drawings, a direction that is parallel to top surfaces of a substrate and/or a base layer is defined as a first direction FD, a direction that is intersecting with the first direction FD and parallel to the top surfaces of a substrate and/or a base layer defined as a second direction SD, and a direction that vertically projects from (that is, perpendicular to) the top surfaces of the substrate and/or the base layer is defined as a third direction TD. The first direction FD may correspond to the extending direction of word lines, and the second direction SD may correspond to the extending direction of bit lines. The first direction FD and the second direction SD may substantially perpendicularly intersect with each other. In the drawings, a direction indicated by an arrow and a direction opposite thereto represent the same direction.

Figure 2:
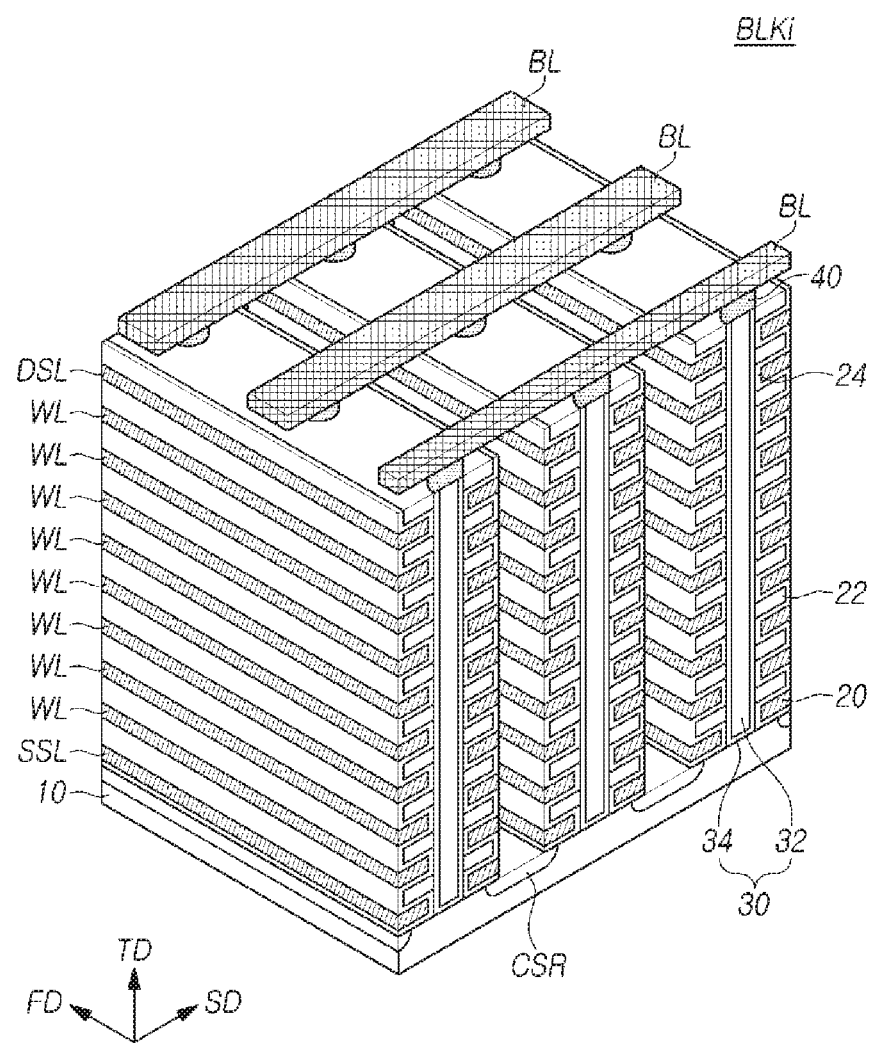
FIG. 2 is a perspective view illustrating a memory block among the memory blocks shown in FIG. 1.

FIG. 2 is a perspective view illustrating a memory block BLKi of the memory blocks shown in FIG. 1. The memory block BLKi may correspond to any one of the memory blocks among the plurality of memory blocks BLK1 to BLKz shown in FIG. 1.

Referring to FIG. 2, a base layer 10 may include polycrystalline silicon doped with an impurity. The base layer 10 may have a first conductivity type, for example, the P-type. In the base layer 10, there may be defined common source regions CSR which extend along the first direction FD and are doped with an impurity of a second conductivity type, for example, the N-type.

A plurality of gate electrode layers 20 and a plurality of dielectric layers 22 may be alternately stacked along the third direction TD on the base layer 10 between two adjacent common source regions CSR. An information storage layer 24 may be additionally formed between the gate electrode layers 20 and the dielectric layers 22.

At least one layer from the lowermost among the gate electrode layers 20 may be used as a source select line SSL. At least one layer from the uppermost among the gate electrode layers 20 may be used as a drain select line DSL. The gate electrode layers 20 between the source select line SSL and the drain select line DSL may be used as word lines WL.

A plurality of channel structures 30 which pass through the gate electrode layers 20 and the dielectric layers 22 in the third direction TD and are coupled to the base layer 10 may be formed. The channel structures 30 may be disposed in such a way as to be separated from one another in the first direction FD and the second direction SD. The number and disposition of the channel structures 30 may be changed variously.

Each of the channel structures 30 may include a channel layer 32 and a gate dielectric layer 34. The channel layer 32 may include polysilicon or monocrystalline silicon, and may include a P-type impurity such as boron (B) in some regions. The channel layer 32 may have the shape of a pillar or a solid cylinder which is completely filled up to its center. While not shown, the channel layer 32 may have tube shape with an open center region. In this case, a buried dielectric layer may be formed in the open center region of the channel layer 32.

The gate dielectric layer 34 may have the shape of a straw or a cylindrical shell which surrounds the outer wall of the channel layer 32. While not shown, the gate dielectric layer 34 may include a tunnel dielectric layer, a charge storage layer, and a blocking layer which are sequentially stacked from the outer wall of the channel layer 32. By way of example and not limitation, the tunnel dielectric layer may include a silicon oxide, a hafnium oxide, an aluminum oxide, a zirconium oxide, or a tantalum oxide. By way of example and not limitation, the charge storage layer may include a silicon nitride, a boron nitride, a silicon boron nitride or polysilicon doped with an impurity. By way of example and not limitation, the blocking layer may include a single layer or a stack layer of a silicon oxide, a silicon nitride, a hafnium oxide, an aluminum oxide, a zirconium oxide and a tantalum oxide. In some embodiments, the gate dielectric layer 34 may have an ONO (oxide-nitride-oxide) stack structure in which an oxide layer, a nitride layer, and an oxide layer are sequentially stacked.

Source select transistors may be formed where the source select line SSL surrounds the channel structures 30, memory cells may be formed where the word lines WL surround the channel structures 30, and drain select transistors may be formed where the drain select line DSL surrounds the channel structures 30. By the above-described structure, a plurality of cell strings each including a source select transistor, memory cells, and a drain select transistor which are disposed along each of the channel structures 30 may be provided.

Drains 40 may be disposed on the channel structures 30, respectively. For example, the drains 40 may include a silicon material which is doped with an impurity. Bit lines BL may be disposed on the drains 40. The bit lines BL may extend in the second direction SD, and may be arranged along the first direction FD. Channel structures 30 which are disposed in a line along the second direction SD may be electrically coupled to one bit line BL.

While it is illustrated in the embodiment of FIG. 2 that eight word lines WL are stacked, it is to be noted that the stack number of word lines is not limited thereto. For example, 4, 16, 32 or 64 word lines may be stacked along the third direction TD. While it is illustrated in the embodiment of FIG. 2 that each of the source select line SSL and the drain select line DSL is disposed at one layer in the third direction TD, it is to be noted that the source select lines SSL and/or the drain select lines DSL may be disposed at two or more layers in the third direction TD.

Figure 3:
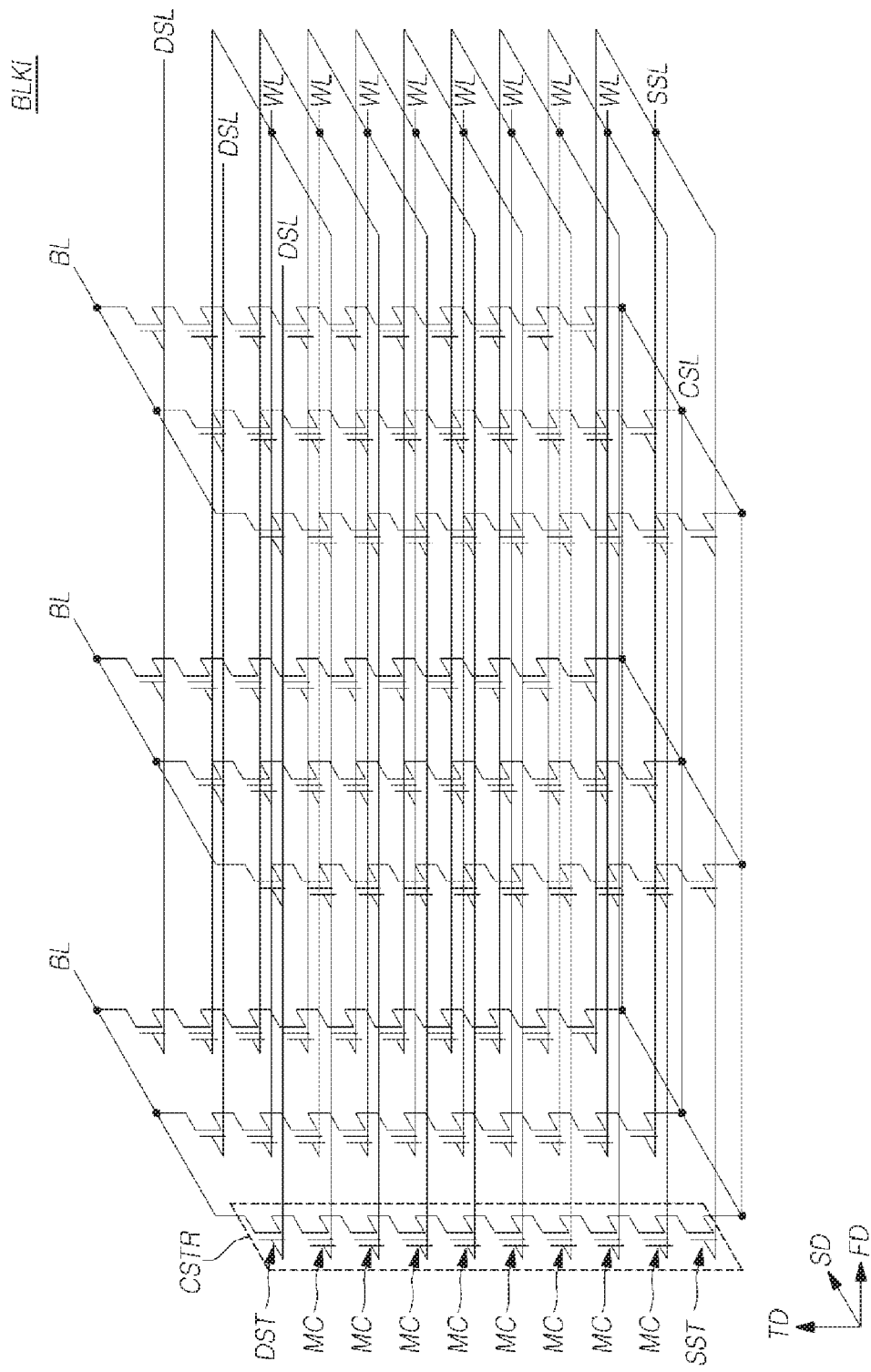
FIG. 3 is an equivalent circuit diagram of the memory block shown in FIG. 2.

FIG. 3 is a circuit diagram illustrating the memory block BLKi shown in FIG. 2. The memory block BLKi may correspond to any one of the memory blocks among the plurality of memory blocks BLK1 to BLKz shown in FIG. 1.

Referring to FIG. 3, the memory block BLKi may include a plurality of cell strings CSTR which are coupled between a plurality of bit lines BL and a common source line CSL.

The bit lines BL may extend in the second direction SD, and may be arranged along the first direction FD. A plurality of cell strings CSTR may be coupled in parallel to each of the bit lines BL, The cell strings CSTR may be coupled in common to the common source line CSL. That is, the plurality of cell strings CSTR may be disposed between the plurality of bit lines BL and one common source line CSL.

Each of the cell strings CSTR may include a drain select transistor DST which is coupled to a bit line BL, a source select transistor SST which is coupled to the common source line CSL, and a plurality of memory cells MC which are coupled between the drain select transistor DST and the source select transistor SST. The drain select transistor DST, the memory cells MC, and the source select transistor SST may be coupled in series along the third direction TD.

Drain select lines DSL, a plurality of word lines WL, and a source select line SSL may be stacked in the third direction TD between the bit lines BL and the common source line CSL. Each of the drain select lines DSL may be coupled to the gates of corresponding drain select transistors DST. Each of the word lines WL may be coupled to the gates of corresponding memory cells MC. The source select line SSL may be coupled to the gates of source select transistors SST.

The group of memory cells which share one word line WL, among the memory cells included in a plurality of cell strings CSTR coupled to a single drain select line DSL, may be defined as a page. For example, one page may be constructed by 16 KB memory cells.

The drain select lines DSL, the plurality of word lines WL, and the source select line SSL may be respectively coupled to local row lines (one of LRL1 to LRLz in FIG. 1), and may be coupled to the row decoder 120 through the local row lines (one of LRL1 to LRLz).

Figure 4:
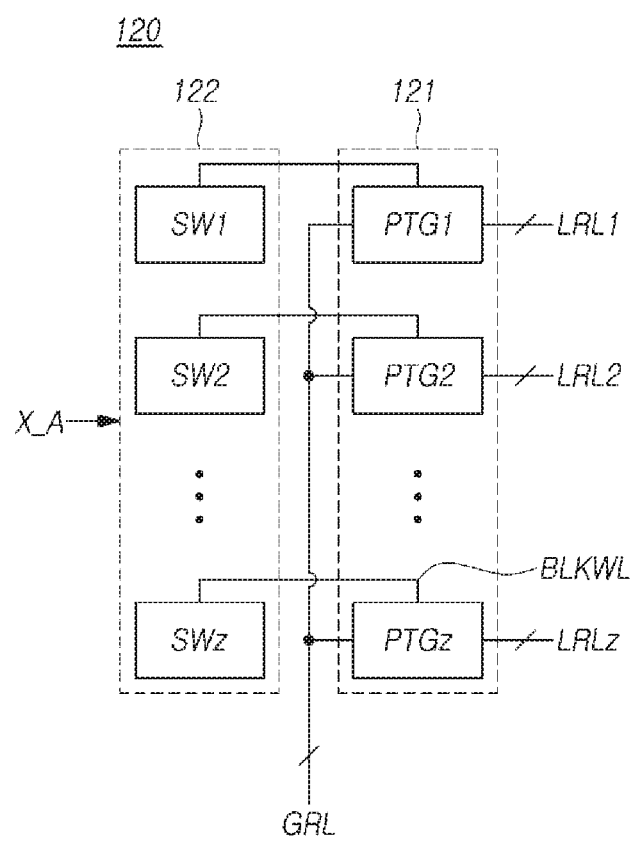
FIG. 4 is a block diagram illustrating a schematic configuration of the row decoder shown in FIG. 1.

FIG. 4 is a block diagram illustrating a schematic configuration of the row decoder 120 shown in FIG. 1.

Referring to FIG. 4, the row decoder 120 may include a pass transistor circuit 121 and a block switch circuit 122.

The pass transistor circuit 121 may include a plurality of pass transistor groups PTG1 to PTGz. The pass transistor groups PTG1 to PTGz may respectively correspond to the memory blocks BLK1 to BLKz included in the first plane 1104. Also, the pass transistor groups PTG1 to PTGz may respectively correspond to the memory blocks BLK1 to BLKz included in the second plane 110-2. Each of the pass transistor groups PTG1 to PTGz may correspond in common to one of the memory blocks BLK1 to BLKz included in the first plane 110-1 and one of the memory blocks BLK1 to BLKz included in the second plane 110-2. Each of the pass transistor groups PTG1 to PTGz may be coupled between each of local row lines LRL1 to LRLz coupled to a pair of corresponding memory blocks and global row lines GRL.

The block switch circuit 122 may receive the row address X_A from the peripheral circuit 140. The block switch circuit 122 may select any one among the pass transistor groups PTG1 to PTGz included in the pass transistor circuit 121, in response to the received row address X_A.

The block switch circuit 122 may include a plurality of block switches SW1 to SWz corresponding to the pass transistor groups PTG1 to PTGz, respectively. As the row address X_A is received from the peripheral circuit 140, any one of the block switches SW1 to SWz may be activated in response to the received row address X_A. The activated block switch may transfer a signal provided from the peripheral circuit 140, to a corresponding pass transistor group through a block word line BLKWL.

The pass transistor group selected by the block switch circuit 122, that is, provided with the signal from the block switch circuit 122, may electrically couple one of the local row lines LRL1 to LRLz which are coupled to a pair of corresponding memory blocks, to the global row lines GRL.

Figure 5:
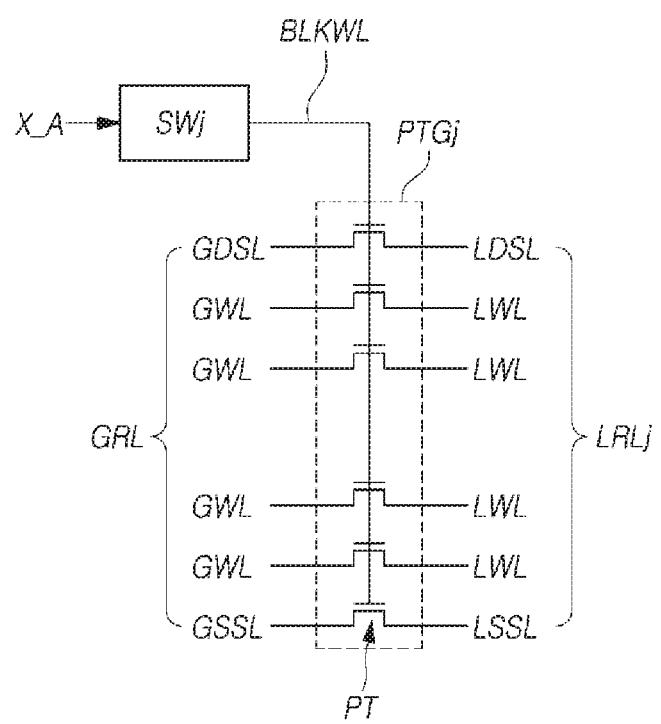
FIG. 5 is a diagram illustrating a coupling relationship between one of the pass transistor groups shown in FIG. 4 and a block switch corresponding thereto.

FIG. 5 is a diagram illustrating a coupling relationship between one pass transistor group PTGj among the pass transistor groups PTG1 to PTGz shown in FIG. 4 and a block switch SWj corresponding to the pass transistor group PTGj. The pass transistor group PTGj may correspond to any one among the pass transistor groups PTG1 to PTGz shown in FIG. 4. The block switch SWj may correspond to any one among the plurality of block switches SW1 to SWz shown in FIG. 4.

Referring to FIG. 5, the pass transistor group PTGj may be coupled between the global row lines GRL and local row lines LRLj. The local row line LRLj may correspond to any one local row line among the plurality of local row lines LRL1 to LRLz shown in FIGS. 1 and 4.

The global row lines GRL may include at least one global drain select line GDSL, a plurality of global word lines GWL and at least one global source select line GSSL. The local row lines LRLj may include at least one local drain select line LDSL, a plurality of local word lines LWL, and at least one local source select line LSSL.

The pass transistor group PTGj may include a plurality of pass transistors PT which are coupled between the global row lines GRL and the local row lines LRLj. The number of the pass transistors PT included in the pass transistor group PTGj may be substantially the same as the number of the gate electrode layers 20 included in a corresponding memory block.

The block switch SWj may be coupled in common to the gate electrodes of the pass transistors PT which are included in the pass transistor group PTGj, through a block word line BLKWL. The block switch SWj may be provided with a signal from the peripheral circuit 140, and may transfer the signal provided with from the peripheral circuit 140, to the block word line BLKWL, in response to the row address X_A.

The pass transistors PT may electrically couple the global row lines GRL and the local row lines LRLj in response to the signal applied to the block word line BLKWL, and may transfer the operating voltages applied to the global row lines GRL, to the local row lines LRLj.

As described above with reference to FIGS. 2 to 5, since the pass transistor circuit 121 includes the pass transistor groups PTG1 to PTGz, the number of which is substantially the same as the number of the memory blocks BLK1 to BLKz, and each of the pass transistor groups PTG1 to PTGz includes the pass transistors PT, the number of which is substantially the same as the number of the gate electrode layers 20 of a corresponding memory block, the number of the pass transistors PT included in the pass transistor circuit 121 increases in proportion to the number of the memory blocks BLK1 to BLKz and the number of the gate electrode layers 20 included in each memory block.

As a semiconductor memory device trends toward high capacity and high integration, the stack number of the gate electrode layers 20 increases, and accordingly, the number of the pass transistors PT included in each of the pass transistor groups PTG1 to PTGz increases as well. If the number of the pass transistors PT included in each of the pass transistor groups PTG1 to PTGz increases, as the occupied area of the pass transistor circuit 121 increases, the degree of integration of the semiconductor memory device may decrease.

If the number of memory blocks is decreased, since the number of pass transistor groups decreases, the area of the pass transistor circuit 121 may be reduced. However, if the number of memory blocks is decreased while maintaining the capacity of the semiconductor memory device as it is, the number of cell strings included in each memory block increases, which may increase the parasitic capacitance value between the cell strings and gate electrode layers, degrading the operation characteristics of the semiconductor memory device.

Embodiments of the present disclosure may provide a semiconductor memory device capable of reducing a size without degrading the operation characteristics.

Figure 6:
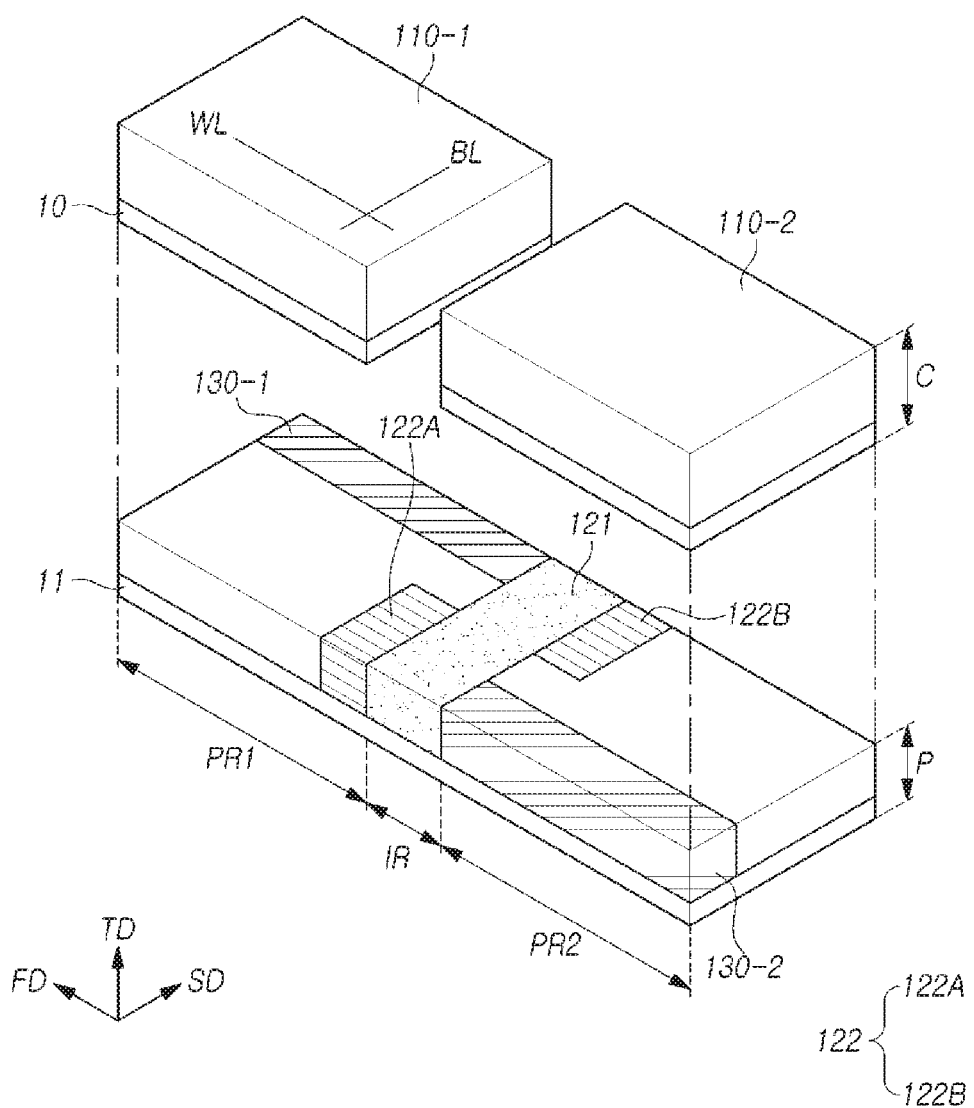
FIG. 6 is a perspective view schematically illustrating a structure of the semiconductor memory device in accordance with the embodiment.
Figure 7:
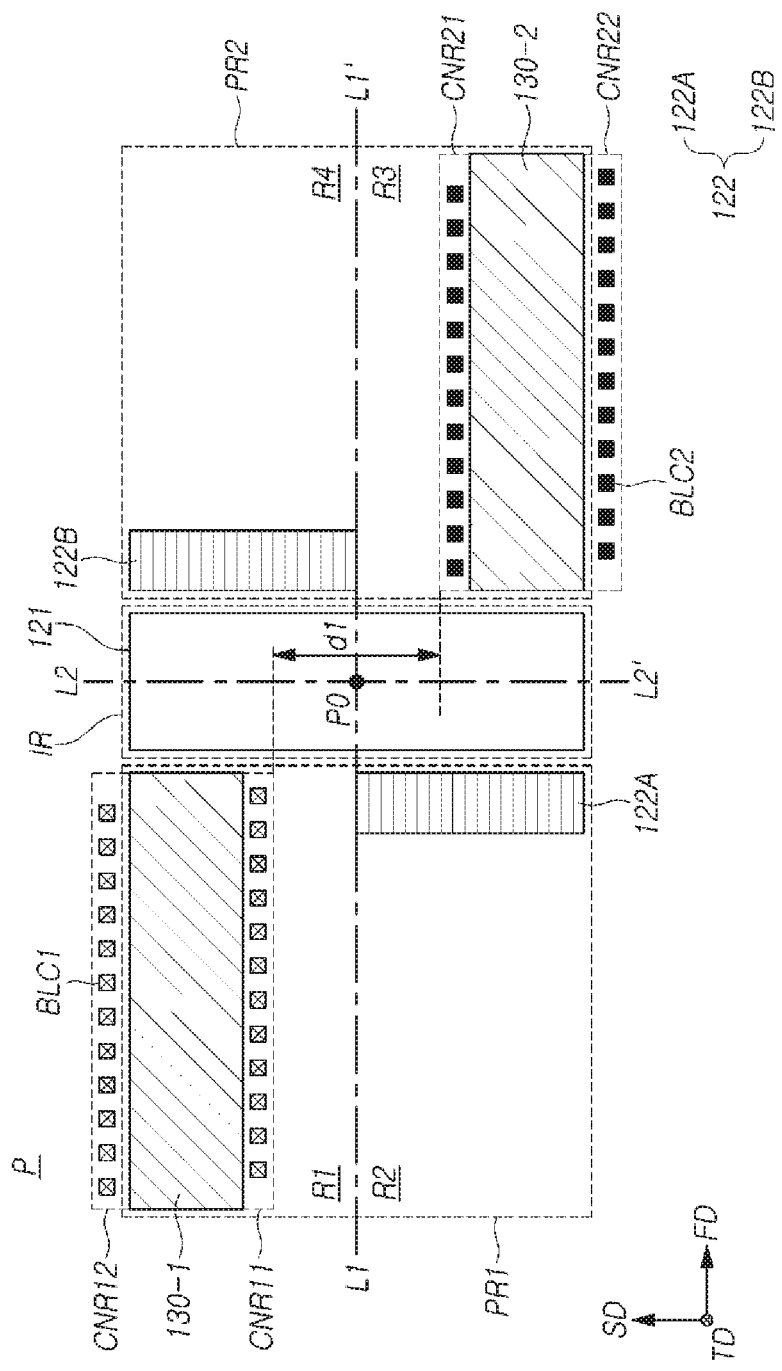
FIG. 7 is a top view schematically illustrating a logic structural body of FIG. 6.

FIG. 6 is a perspective view schematically illustrating the semiconductor memory device 100 in accordance with the embodiment. FIG. 7 is a top view schematically illustrating a logic structural body of FIG. 6.

Referring to FIG. 6, the semiconductor memory device 100 may have a peri under cell (PUC) structure. A logic structural body P which includes the pass transistor circuit 121, the block switch circuit 122, and the first and second page buffer circuits 130-1 and 130-2 may be disposed under a memory structural body C which includes the first and second planes 110-1 and 110-2.

The memory structural body C may include the base layer 10, and the logic structural body P may include a substrate 11.

The first and second planes 110-1 and 110-2 may be disposed on the base layer 10, and the pass transistor circuit 121, the block switch circuit 122, and the first and second page buffer circuits 130-1 and 130-2 may be disposed on the substrate 11.

The pass transistor circuit 121 may be disposed adjacent to the first and second planes 110-1 and 110-2 in a region between the first plane 110-1 and the second plane 110-2.

The pass transistor circuit 121 may be disposed to have a shape extending in the second direction SD as a direction perpendicular to word lines WL, that is, a direction in which memory blocks are arranged. The elements included in the pass transistor circuit 121, that is, the pass transistor groups PTG1 to PTGz (see FIG. 4), may be disposed along the second direction SD. The pass transistor circuit 121 may be disposed to have substantially the same length as the first and second planes 110-1 and 110-2 in the second direction SD.

Since the pass transistor circuit 121 is disposed adjacent to the first and second planes 110-1 and 110-2 and the pass transistor groups included in the pass transistor circuit 121 are arranged along the direction in which the memory blocks of the first and second planes 110-1 and 110-2 are arranged, it is possible to shorten a time during which operating voltages from the pass transistor groups are transferred to the memory blocks of the first and second planes 110-1 and 110-2. Also, since the pass transistor circuit 121 is disposed between the first plane 110-1 and the second plane 110-2, the deviation between a time required for operating voltages from the pass transistor groups included in the pass transistor circuit 121 to be transferred to the first plane 110-1 and a time required for the operating voltages to be transferred to the second plane 110-2 may be decreased, whereby it is possible to suppress operation characteristics from degrading due to the deviation in signal transfer time.

The first page buffer circuit 130-1 may be disposed to overlap with the first plane 110-1 in the third direction TD, and the second page buffer circuit 130-2 may be disposed to overlap with the second plane 110-2 in the third direction TD.

The first and second page buffer circuits 130-1 and 130-2 may be disposed to have shapes extending in the first direction FD as a direction perpendicular to bit lines BL, that is, a direction in which the bit lines BL are arranged. The elements included in the respective first and second page buffer circuits 130-1 and 130-2, that is, the page buffers PB, may be disposed along the first direction FD. The first page buffer circuit 130-1 may be disposed to have substantially the same length as the first plane 110-1 in the first direction FD. The second page buffer circuit 130-2 may be disposed to have substantially the same length as the second plane 110-2 in the first direction FD.

The elements included in the block switch circuit 122, that is, the block switches SW1 to SWz (see FIG. 4), may be disposed by being divided into a first sub block switch circuit 122A and a second sub block switch circuit 122B. The first sub block switch circuit 122A may be disposed to overlap with the first plane 110-1 in the third direction TD, and the second sub block switch circuit 122B may be disposed to overlap with the second plane 110-2 in the third direction TD.

Each of the first and second sub block switch circuits 122A and 122B may be disposed to have a shape extending in the second direction SD as the extending direction of the pass transistor circuit 121. The first and second sub block switch circuits 122A and 122B may be disposed such that the sum of the length of the first sub block switch circuit 122A and the length of the second sub block switch circuit 122B in the second direction SD is substantially the same as the length of the pass transistor circuit 121.

The first and second sub block switch circuits 122A and 122B and the first and second page buffer circuits 130-1 and 130-2 may be disposed in the form of a windmill to completely overlap with the first and second planes 110-1 and 110-2 in the third direction TD.

Referring to FIG. 7, the logic structural body P may have a first plane region PR1 which overlaps with the first plane 110-1 in the third direction TD, a second plane region PR2 which overlaps with the second plane 110-2 in the third direction TD, and an interval region IR between the first plane region PR1 and the second plane region PR2.

The first plane region PR1 may include first and second regions R1 and R2 divided by a first virtual line L1-L1' which extends in the first direction FD, i.e., parallel to the word lines WL, and the second plane region PR2 may include third and fourth regions R3 and R4 which are divided by the first virtual line L1-L1'.

The first region R1 and the fourth region R4 may be disposed opposite to each other in the first direction FD with the interval region IR interposed therebetween, and the second region R2 and the third region R3 may be disposed opposite to each other in the first direction FD with the interval region IR interposed therebetween.

The pass transistor circuit 121 may be disposed in the interval region IR of the logic structural body P. The first and second page buffer circuits 130-1 and 130-2 may be respectively disposed in the first and third regions R1 and R3 of the logic structural body P, and the first and second sub block switch circuits 122A and 122B may be respectively disposed in the second and fourth regions R2 and R4 of the logic structural body P.

When a second virtual line L2-L2', which passes through the center part of the interval region IR and extends along the second direction SD, intersects with the first virtual line L1-L1' at a point P0 in the interval region IR, the first page buffer circuit 130-1 and the second page buffer circuit 130-2 may be disposed symmetrically to each other with respect to the point P0, and the first sub block switch circuit 122A and the second sub block switch circuit 122B may be disposed symmetrically to each other with respect to the point P0.

The first sub block switch circuit 122A may be disposed to have substantially the same length as the second region R2 in the second direction SD, and the second sub block switch circuit 122B may be disposed to have substantially the same length as the fourth region R4 in the second direction SD. The sum of the length of the first sub block switch circuit 122A in the second direction SD and the length of the second sub block switch circuit 122B in the second direction SD may be substantially the same as the length of the pass transistor circuit 121 in the second direction SD.

The first and second sub block switch circuits 122A and 122B may be adjacent to the pass transistor circuit 121 in the first direction FD, and may be adjacent to the first virtual line L1-L1' in the second direction SD.

First bit line contact regions CNR11 and CNR12 may be disposed adjacent to both edges of the first page buffer circuit 130-1, which face away from each other in the second direction SD. Bit line contacts BLC1 may be disposed in the first bit line contact regions CNR11 and CNR12. The bit line contacts BLC1 may extend in the third direction TD, and may couple the bit lines arranged in the first plane 110-1 and the page buffers included in the first page buffer circuit 130-1. While not shown, bit line contacts BLC1, which are coupled to even bit lines among the bit lines arranged in the first plane 110-1, may be disposed in one among the first bit line contact regions CNR11 and CNR12, and bit line contacts BLC1, which are coupled to odd bit lines may be disposed in the other one among the first bit line contact regions CNR11 and CNR12. For example, when the bit line contacts BLC1 that are coupled to even bit lines among the bit lines arranged in the first plane 110-1 are disposed in the first bit line contact region CNR11, the bit line contacts BLC1 that are coupled to odd bit lines may be disposed in the first bit line contact regions CNR12. Due to this fact, bit line contacts BLC1, which are disposed in the first bit line contact regions CNR11, and bit line contacts BLC1, which are disposed in the first bit line contact regions CNR12, may be arranged in a zigzag style.

Second bit line contact regions CNR21 and CNR22 may be disposed adjacent to both edges of the second page buffer circuit 130-2, which face away from each other in the second direction SD. Bit line contacts BLC2 may be disposed in the second bit line contact regions CNR21 and CNR22. The bit line contacts BLC2 may extend in the third direction TD, and may couple the bit lines arranged in the second plane 110-2 and the page buffers included in the second page buffer circuit 130-2. The bit line contacts BLC2 may also be disposed in a manner similar to the bit line contacts BLC1.

The first and second page buffer circuits 130-1 and 130-2 may be disposed to be maximally separated from each other in the second direction SD. In this case, one among the first bit line contact regions CNR11 and CNR12 may be disposed in the first region R1 of the first plane region PR1, and the other one among the first bit line contact regions CNR11 and CNR12 may be disposed outside the first plane region PR1. For example, when the first contact region CNR11 is disposed in the first region R1 of the first plane region PR1, the first contact region CNR12 may be disposed outside the first plane region PR1. Similar to the first bit line contact regions CNR11 and CNR12, one among the second bit line contact regions CNR21 and CNR22 may be disposed in the third region R3 of the second plane region PR2, and the other one among the second bit line contact regions CNR21 and CNR22 may be disposed outside the second plane region PR2. For example, when the second contact region CNR21 is disposed in the third region R3 of the second plane region PR2, the second contact region CNR21 may be disposed outside the second plane region PR2.

In the second direction SD, the length of the first page buffer circuit 130-1 may be smaller than the length of the first region R1, and the length of the second page buffer circuit 130-2 may be smaller than the length of the third region R3. In this case, the first bit line contact regions CNR11 disposed in the first region R1 and the second bit line contact regions CNR21 disposed in the third region R3 may be offset by a predetermined distance, for example, a first distance d1, along the second direction SD.

Figure 8:
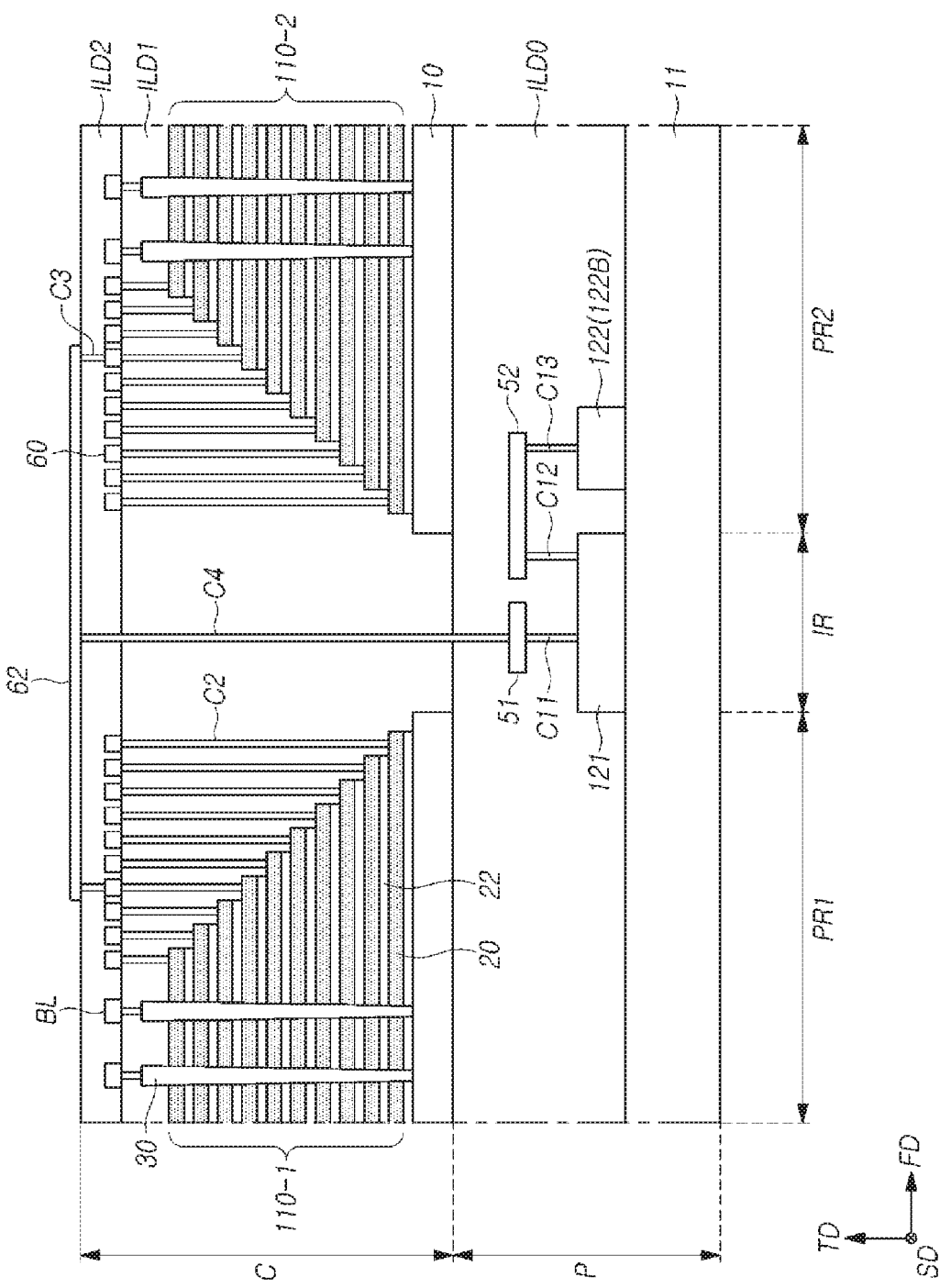
FIGS. 8 to 10 are cross-sectional views illustrating the semiconductor memory device in accordance with the embodiment.
Figure 9:
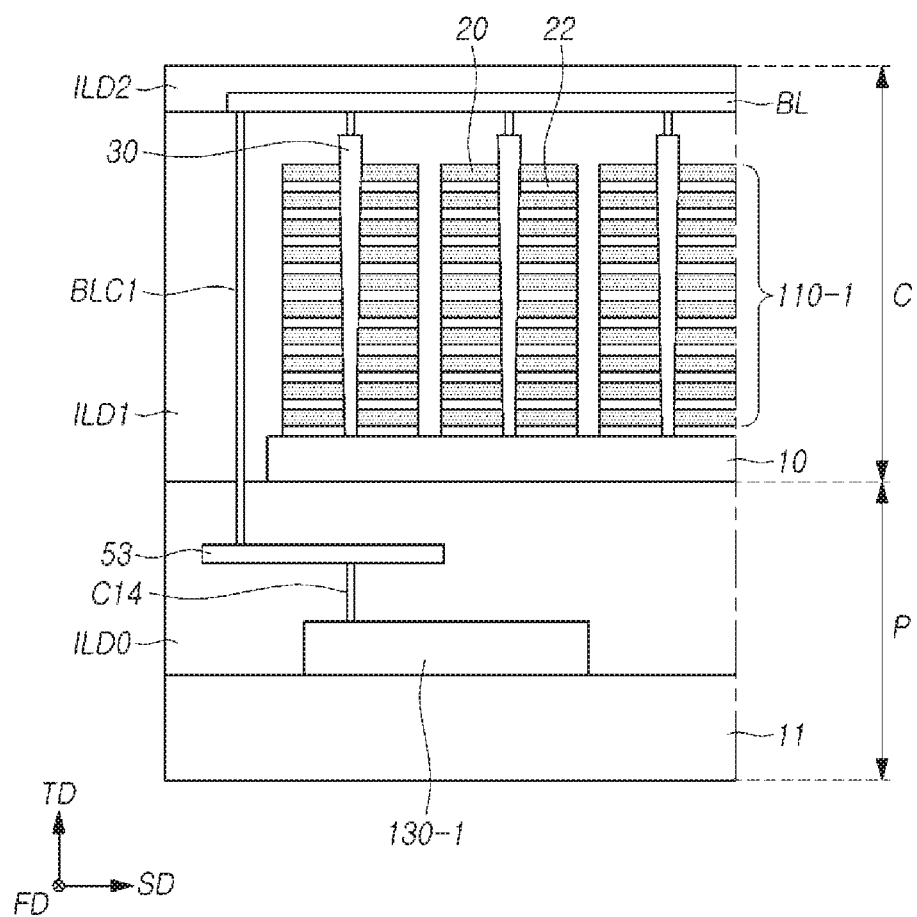
Figure 10:
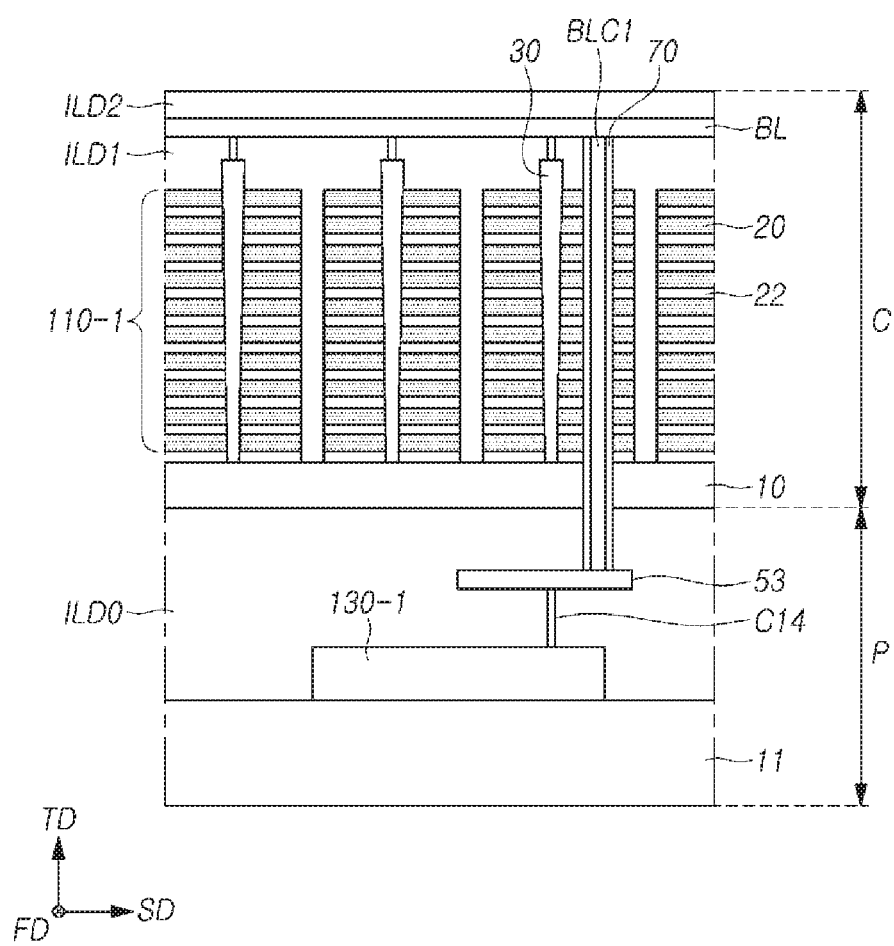

FIGS. 8 to 10 illustrate examples of structures for electrically coupling the first and second planes 110-1 and 110-2 formed in the memory structural body C and the circuits 121, 122, 130-1 and 130-2 formed in the logic structural body P of FIG. 6.

Referring to FIGS. 8 to 10, the logic structural body P may include the substrate 11 on which the circuits 121, 122, 130-1 and 130-2 (not shown) are formed, a bottom dielectric layer ILD0 which is stacked on the substrate 11 in the third direction TD and covers the circuits 121, 122, 130-1 and 130-2 (not shown), and bottom wiring lines 51 to 53 which are disposed in the bottom dielectric layer ILD0. By way of example and not limitation, the bottom dielectric layer ILD0 may include a dielectric material such as a silicon oxide.

The circuits 121, 122, 130-1 and 130-2 (not shown) may respectively correspond to the pass transistor circuit 121, the block switch circuit 122, and the first and second page buffer circuits 130-1 and 130-2 described above. The circuits 121, 122, 130-1 and 130-2 may be electrically coupled with the bottom wiring lines 51 to 53 through contact plugs C11 to C14.

Referring to FIG. 8, the memory structural body C may include the base layer 10, the first and second planes 110-1 and 110-2 which are disposed on the base layer 10, a first top dielectric layer ILD1, which is formed on the base layer 10 and covers the first and second planes 110-1 and 110-2, and a second top dielectric layer ILD2, which is disposed on the first top dielectric layer ILD1.

The base layer 10 may be disposed on the bottom dielectric layer ILD0 of the logic structural body P. The bottom surface of the base layer 10 may be brought into contact with the top surface of the bottom dielectric layer ILD0. By way of example and not limitation, the base layer 10 may be formed of polycrystalline silicon. Unlike the substrate 11, which may use a monocrystalline silicon substrate, the base layer 10 may be formed on the bottom dielectric layer ILD0 and thus the base layer 10 may be formed of polycrystalline silicon.

The first plane 110-1 may be disposed on the first plane region PR1 of the base layer 10. The second plane 110-2 may be disposed on the second plane region PR2 of the base layer 10. Each of the first and second planes 110-1 and 110-2 may include the gate electrode layers 20 and the dielectric layers 22 which are alternately stacked on the base layer 10 along the third direction TD, and the plurality of channel structures 30 which pass through the gate electrode layers 20 and the dielectric layers 22 in the third direction TD.

The gate electrode layers 20 and the dielectric layers 22 included in the first plane 110-1 may extend by different lengths from one another along the first direction FD toward the interval region IR where the pass transistor circuit 121 is positioned, and may have a step structure at an edge of the first plane region PR1 which is adjacent to the interval region IR. At the edge of the first plane region PR1 which is adjacent to the interval region IR, each of the gate electrode layers 20 which are included in the first plane 110-1 may be exposed by a gate electrode layer positioned thereon. Similar to the gate electrode layers 20 which are included in the first plane 110-1, the gate electrode layers 20 which are included in the second plane 110-2 may also have a step structure at an edge of the second plane region PR2 which is adjacent to the interval region IR. The gate electrode layers 20 which are included in the first and second planes 110-1 and 110-2 may have the step structures only at one edges thereof which are adjacent to the interval region IR. According to the present embodiment, since the pass transistor circuit 121 is disposed between the two planes 110-1 and 110-2 and the planes 110-1 and 110-2 have the step structures only at one edges which are adjacent to the pass transistor circuit 121, the number and the occupied area of the step structures may be reduced, whereby it is possible to improve the degree of integration.

On the step structures of the gate electrode layers 20, a plurality of contact plugs C2, which pass through the first top dielectric layer ILD1 in the third direction TD and are respectively coupled to the gate electrode layers 20, may be formed. The gate electrode layers 20 may be electrically coupled with first top wiring lines 60, which are formed on the first top dielectric layer ILD1, through the contact plugs C2. The first top wiring lines 60 may be disposed at the same layer as the bit lines BL.

The second top dielectric layer ILD2, which covers the bit lines BL and the first top wiring lines 60, may be formed on the first top dielectric layer ILD1. Contact plugs C3 which pass through the second top dielectric layer ILD2 in the third direction TD and are coupled to the first top wiring lines 60 may be formed on the first top wiring lines 60, respectively. The first top wiring lines 60 may be electrically coupled with second top wiring lines 62, which are formed on the second top dielectric layer ILD2, through the contact plugs C3.

Through contact plugs C4 which pass through the second top dielectric layer ILD2, the first top dielectric layer ILD1 and the bottom dielectric layer ILD0 in the interval region IR, conductive paths may be formed between the second top wiring lines 62 which are coupled to the gate electrode layers 20 of the memory structural body C and the bottom wiring lines 51 which are coupled to the pass transistor circuit 121 of the logic structural body P. The contact plugs C4 may be used to electrically couple the gate electrode layers 20 of the memory structural body C and the pass transistor circuit 121 of the logic structural body P.

Gate electrode layers that are disposed at the same layer, among the gate electrode layers 20 included in the first plane 110-1 and the gate electrode layers 20 included in the second plane 110-2, may be coupled in common to one second top wiring line 62, and may be coupled in common to the pass transistor circuit 121 through the second top wiring line 62 and the contact plug C4 coupled thereto.

Referring to FIG. 9, conductive paths may be formed between the bit lines BL of the memory structural body C and the first page buffer circuit 130-1 of the logic structural body P at one side of the first plane 110-1 in the second direction SD.

The bit line contact plugs BLC1 which pass through the first top dielectric layer ILD1 and the bottom dielectric layer ILD0 may be formed. The bit line contact plugs BLC1 may be used to electrically couple the bit lines BL, which are disposed in the first plane 110-1, to the first page buffer circuit 130-1 of the logic structural body P.

Referring to FIG. 10, through the bit line contact plugs BLC1 which are formed through the plurality of gate electrode layers 20 and the plurality of dielectric layers 22 between the channel structures 30 of the first plane 110-1, conductive paths may be formed between the bit lines BL of the memory structural body C and the first page buffer circuit 130-1 of the logic structural body P.

The bit line contact plugs BLC1 and dielectric layer patterns 70, both of which pass through the gate electrode layers 20, the dielectric layers 22 and the bottom dielectric layer ILD0 may be formed. The bit line contact plugs BLC1 may be used to electrically couple the bit lines BL, which are disposed in the first plane 110-1, to the first page buffer circuit 130-1 of the logic structural body P.

While not shown, conductive paths between the bit lines BL and the second page buffer circuit 130-2 may also be realized in a manner similar to the conductive paths between the bit lines BL and the first page buffer circuit 130-1 shown in FIGS. 9 and 10.

Figure 11:
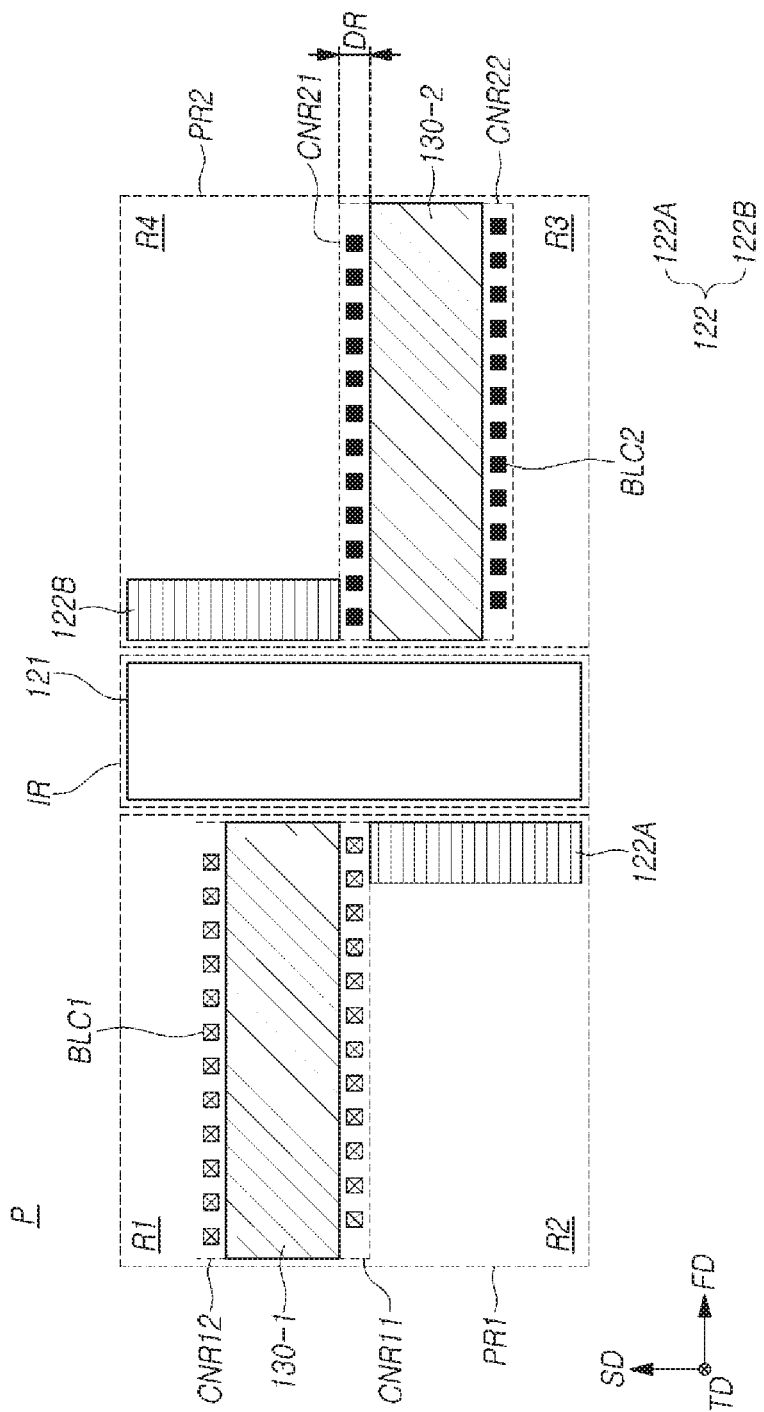
FIG. 11 is a top view schematically illustrating a logic structural body of a semiconductor memory device in accordance with an embodiment.

FIG. 11 is a top view schematically illustrating the logic structural body P of a semiconductor memory device in accordance with an embodiment.

Referring to FIG. 11, a dummy region DR, which extends in a direction parallel to word lines WL may be defined. A first plane region PR1 may include first and second regions R1 and R2, which are disposed at opposite sides of the dummy region DR, and a second plane region PR2 may include third and fourth regions R3 and R4, which are disposed at opposite sides of the dummy region DR.

A first sub block switch circuit 122A may be disposed to have substantially the same length as the second region R2 in the second direction SD, and a second sub block switch circuit 122B may be disposed to have substantially the same length as the fourth region R4 in the second direction SD. The sum of the length of the first sub block switch circuit 122A in the second direction SD and the length of the second sub block switch circuit 122B in the second direction SD may be smaller than the length of a first plane 110-1 or a second plane 110-2 in the second direction SD.

The first and second sub block switch circuits 122A and 122B may be adjacent to an interval region IR in the first direction FD, and may be adjacent to the dummy region DR in the second direction SD. In the second direction SD, the first sub block switch circuit 122A and the second sub block switch circuit 122B may be offset by the width of the dummy region DR.

First and second page buffer circuits 130-1 and 130-2 may be disposed to be minimally separated from each other in the second direction SD. First bit line contact regions CNR11 and second bit line contact regions CNR21 may be disposed in the dummy region DR, and may be positioned on the same line along the first direction FD. That is, in the second direction SD, the first bit line contact regions CNR11 and the second bit line contact regions CNR21 may not be offset but be aligned with each other. As the first bit line contact regions CNR11 and the second bit line contact regions CNR21 are aligned in the second direction SD, the semiconductor memory device may have a decreased length in the second direction SD.

Figure 12:
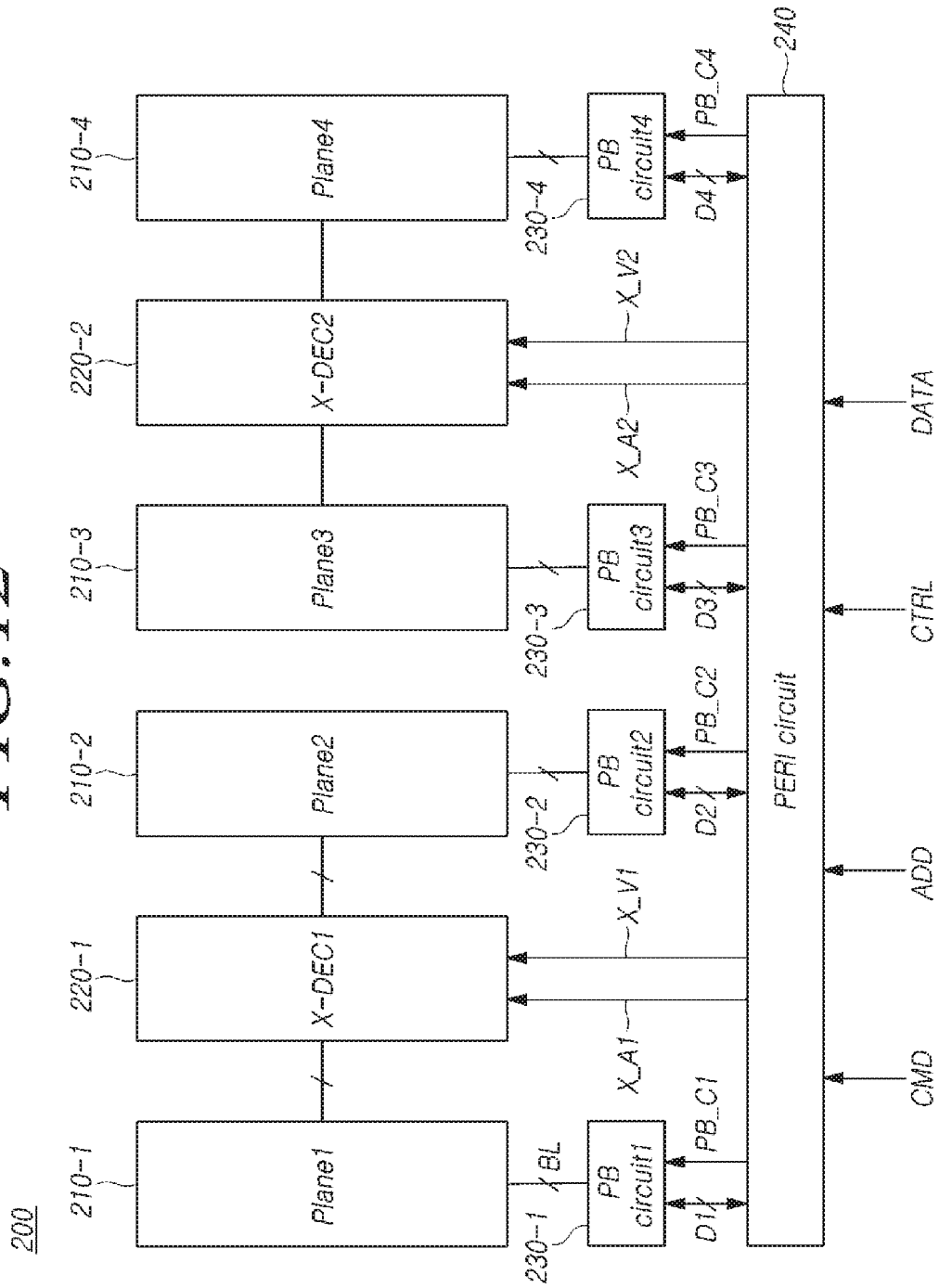
FIG. 12 is a block diagram illustrating a semiconductor memory device in accordance with an embodiment.

FIG. 12 is a block diagram illustrating a semiconductor memory device 200 in accordance with an embodiment.

When compared to the semiconductor memory device 100 of FIG. 1, the semiconductor memory device 200 of FIG. 12 may include two pairs of planes 210-1 to 210-4, and may include two row decoders 220-1 and 220-2, and two pairs of page buffer circuits 230-1 to 230-4 corresponding to the two pairs of planes 210-1 to 210-4.

A peripheral circuit 240 may represent components which are included in the semiconductor memory device 200, except the planes 210-1 to 210-4, the row decoders 220-1 and 220-2, and the page buffer circuits 230-1 to 230-4.

A first plane 210-1 and a second plane 210-2 may be coupled in common to a first row decoder 220-1 through local row lines. A third plane 210-3 and a fourth plane 210-4 may be coupled in common to a second row decoder 220-2 through local row lines. The first and second planes 210-1 and 210-2 may be included in a first operation group, and the third and fourth planes 210-3 and 210-4 may be included in a second operation group. The first operation group and the second operation group may selectively operate.

The first row decoder 220-1 may transfer operating voltages to the planes 210-1 and 210-2 which are included in the first operation group, and the second row decoder 220-2 may transfer operating voltages to the planes 210-3 and 210-4 which are included in the second operation group. The first and second row decoders 220-1 and 220-2 may be selectively driven such that operating voltages are transferred to any one of the first operation group and the second operation group.

First to fourth page buffer circuits 230-1 to 230-4 may correspond to the first to fourth planes 210-1 to 210-4, respectively. Each of the first to fourth planes 210-1 to 210-4 may be coupled to a corresponding one among the page buffer circuits 230-1 to 230-4 through bit lines BL.

The peripheral circuit 240 may receive a command CMD, an address signal ADD, a control signal CTRL and a data signal DATA from outside the semiconductor memory device 200, and may generate operating voltages and control signals. For example, the peripheral circuit 240 may generate a first driving voltage X_V1 and a first row address X_A1 for the first and second planes 210-1 and 210-2 of the first operation group, and may generate a second driving voltage X_V2 and a second row address X_A2 for the third and fourth planes 210-3 and 210-4 of the second operation group. The peripheral circuit 240 may generate first to fourth page buffer control signals PB_C1 to PB_C4 for the first to fourth planes 210-1 to 210-4.

Figure 13:
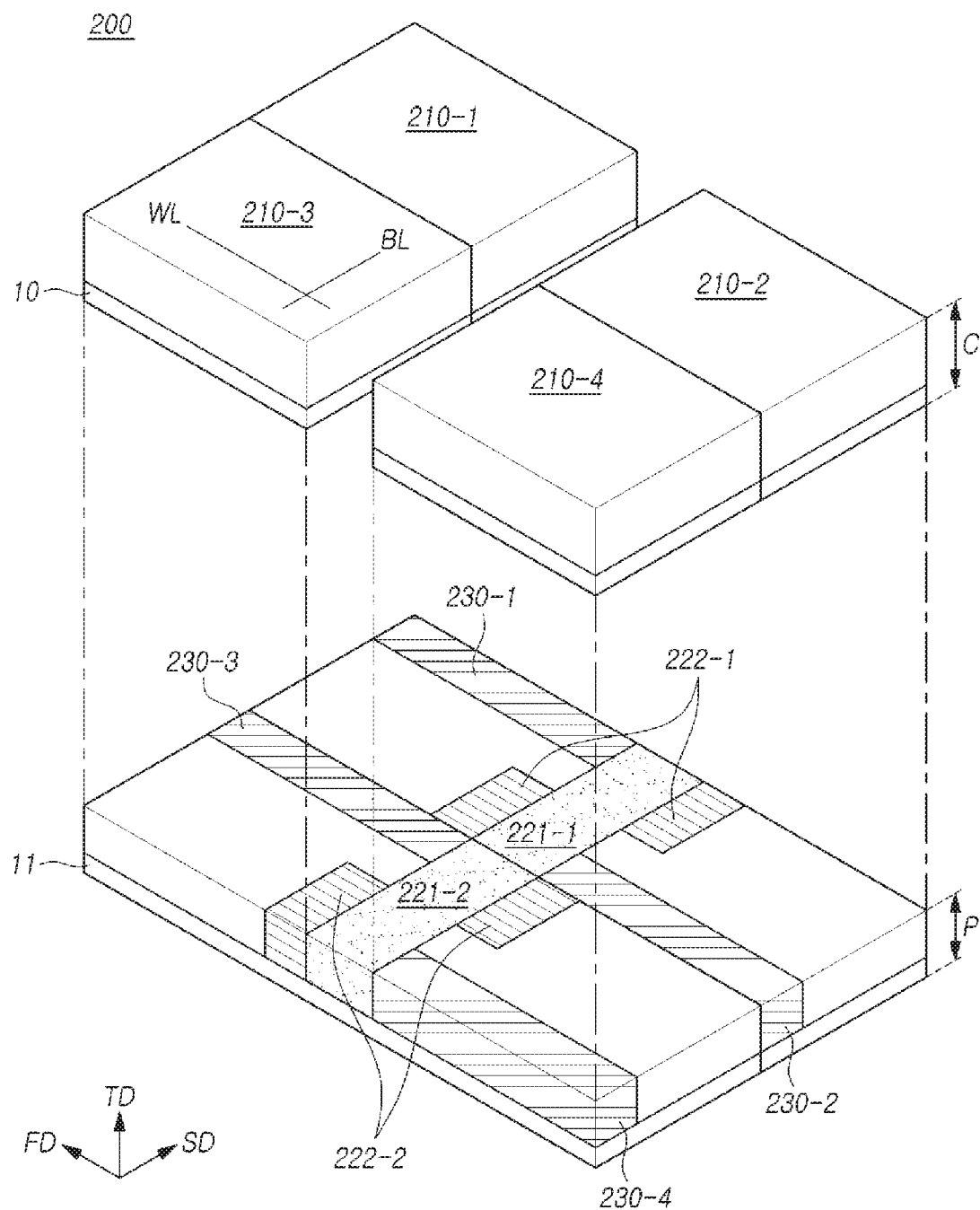
FIG. 13 is a perspective view schematically illustrating the structure of the semiconductor memory device shown in FIG. 12.

FIG. 13 is a perspective view schematically illustrating the structure of the semiconductor memory device 200 shown in FIG. 12.

Referring to FIG. 13, a logic structural body P including first and second pass transistor circuits 221-1 and 221-2, first and second block switch circuits 222-1 and 222-2, and the first to fourth page buffer circuits 230-1 to 230-4 may be disposed under a memory structural body C including the first to fourth planes 210-1 to 210-4.

The first pass transistor circuit 221-1 and the first block switch circuit 222-1 may be components which are included in the first row decoder 220-1, and the second pass transistor circuit 221-2 and the second block switch circuit 222-2 may be components which are included in the second row decoder 220-2.

The first pass transistor circuit 221-1 may be disposed in a region between the first plane 210-1 and the second plane 210-2, and the second pass transistor circuit 221-2 may be disposed in a region between the third plane 210-3 and the fourth plane 210-4.

The first block switch circuit 222-1 and the first and second page buffer circuits 230-1 and 230-2 may be disposed to overlap with the first and second planes 210-1 and 210-2 in the third direction TD, and the second block switch circuit 222-2 and the third and fourth page buffer circuits 230-3 and 230-4 may be disposed to overlap with the third and fourth planes 210-3 and 210-4 in the third direction TD. Also, similar to the description above with reference to FIG. 6, each of the first block switch circuit 222-1 and the second block switch circuit 222-2 may be disposed by being divided into two sub block switch circuits.

While FIGS. 12 and 13 illustrate the semiconductor memory device 200 including four planes, it is to be noted that the technical spirit of the embodiment is not limited thereto. A semiconductor memory device in accordance with an embodiment may include 2N (N is a natural number) number of planes. While FIG. 13 illustrates a case where the planes 210-1 to 210-4 are arranged in the form of a matrix along the first direction FD and the second direction SD, it is to be noted that planes may be disposed in series along the first direction FD or the second direction SD.

FIG. 14 is a table describing the data processing operation of the semiconductor memory device 200 shown in FIG. 12.

Referring to FIGS. 12 and 14, the first and second planes 210-1 and 210-2 are included in the first operation group, and may be provided with operating voltages through the first row decoder 220-1. The first plane 210-1 and the second plane 210-2 may be controlled independently of each other in their operations (for example, program operations and read operations) through the first page buffer circuit 230-1 and the second page buffer circuit 230-2.

The third and fourth planes 210-3 and 210-4 are included in the second operation group, and may be provided with operating voltages through the second row decoder 220-2. The third plane 210-3 and the fourth plane 210-4 may be controlled independently of each other in their operations through the third page buffer circuit 230-3 and the fourth page buffer circuit 230-4. Operating voltages from the peripheral circuit 240 may be provided to any one of the first operation group and the second operation group through the first row decoder 220-1 or the second row decoder 220-2.

In the case where the size of one page in each of the first to fourth planes 210-1 to 210-4 is 16 KB, the semiconductor memory device 200 may process data of 32 KB or 16 KB. For example, in the case where the page buffer circuits 230-1 and 230-2 corresponding to the first and second planes 210-1 and 210-2 are selected or the page buffer circuits 230-3 and 230-4 corresponding to the third and fourth planes 210-3 and 210-4 are selected, the semiconductor memory device 200 may process data of 32 KB. On the other hand, in the case where one of the page buffer circuits 230-1 and 230-2 corresponding to the first and second planes 210-1 and 210-2 or one of the page buffer circuits 230-3 and 230-4 corresponding to the third and fourth planes 210-3 and 210-4 is selected, the semiconductor memory device 200 may process data of 16 KB.

As is apparent from the above descriptions, since two planes are disposed in such a way as to share one row decoder, the occupied area of row decoders may be reduced, and thereby, the degree of integration may be improved. Further, since a pass transistor circuit is disposed between two planes and each of the planes has a stepped structure at only one side thereof which is adjacent to the pass transistor circuit, the numbers and occupied area of stepped structures may be decreased, and thereby, the degree of integration may be improved. Since a block switch circuit is disposed in such a way as to vertically overlap with a memory cell array, the degree of integration may be improved.

Figure 15:
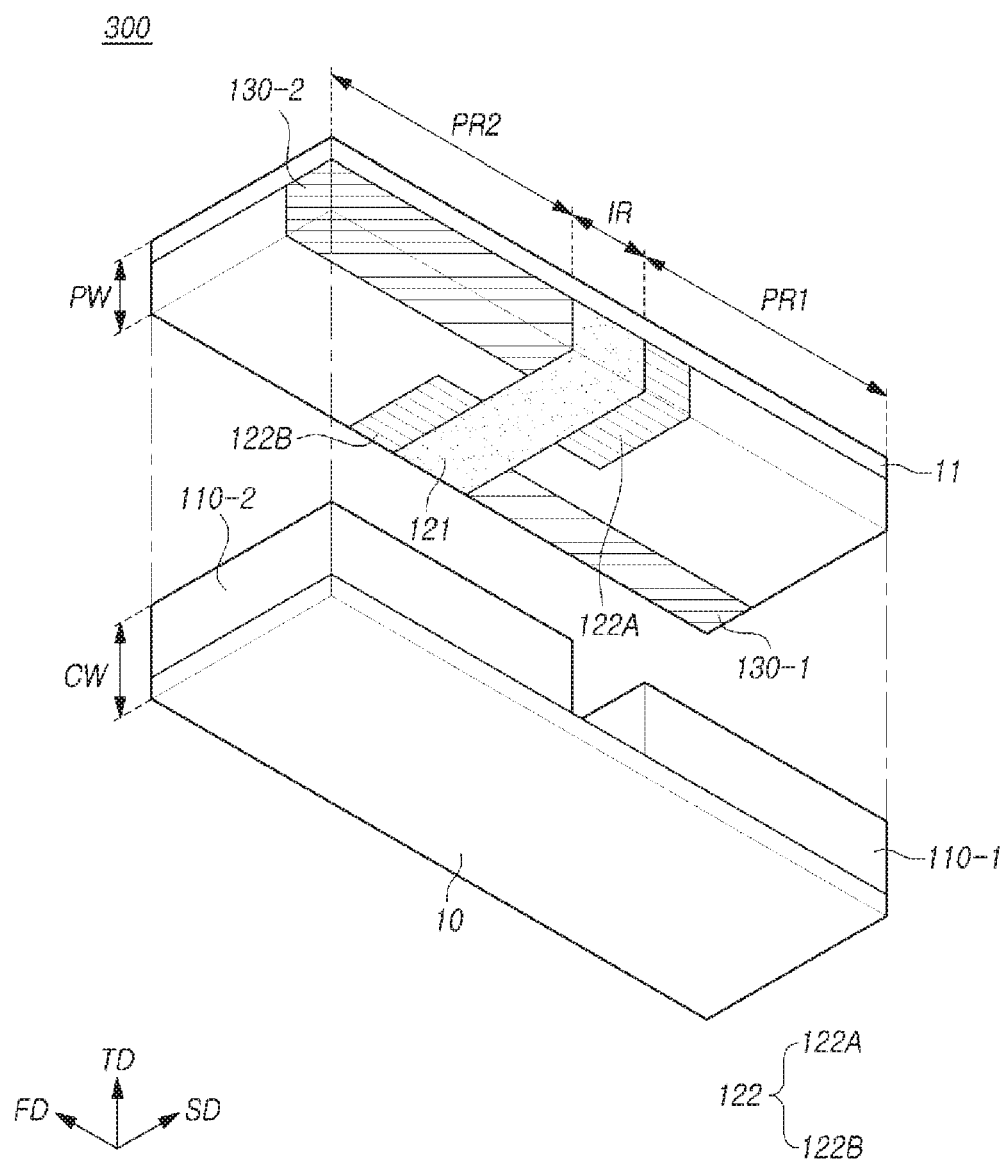
FIG. 15 is a perspective view schematically illustrating a representation of an example of a semiconductor memory device in accordance with an embodiment.
Figure 16:
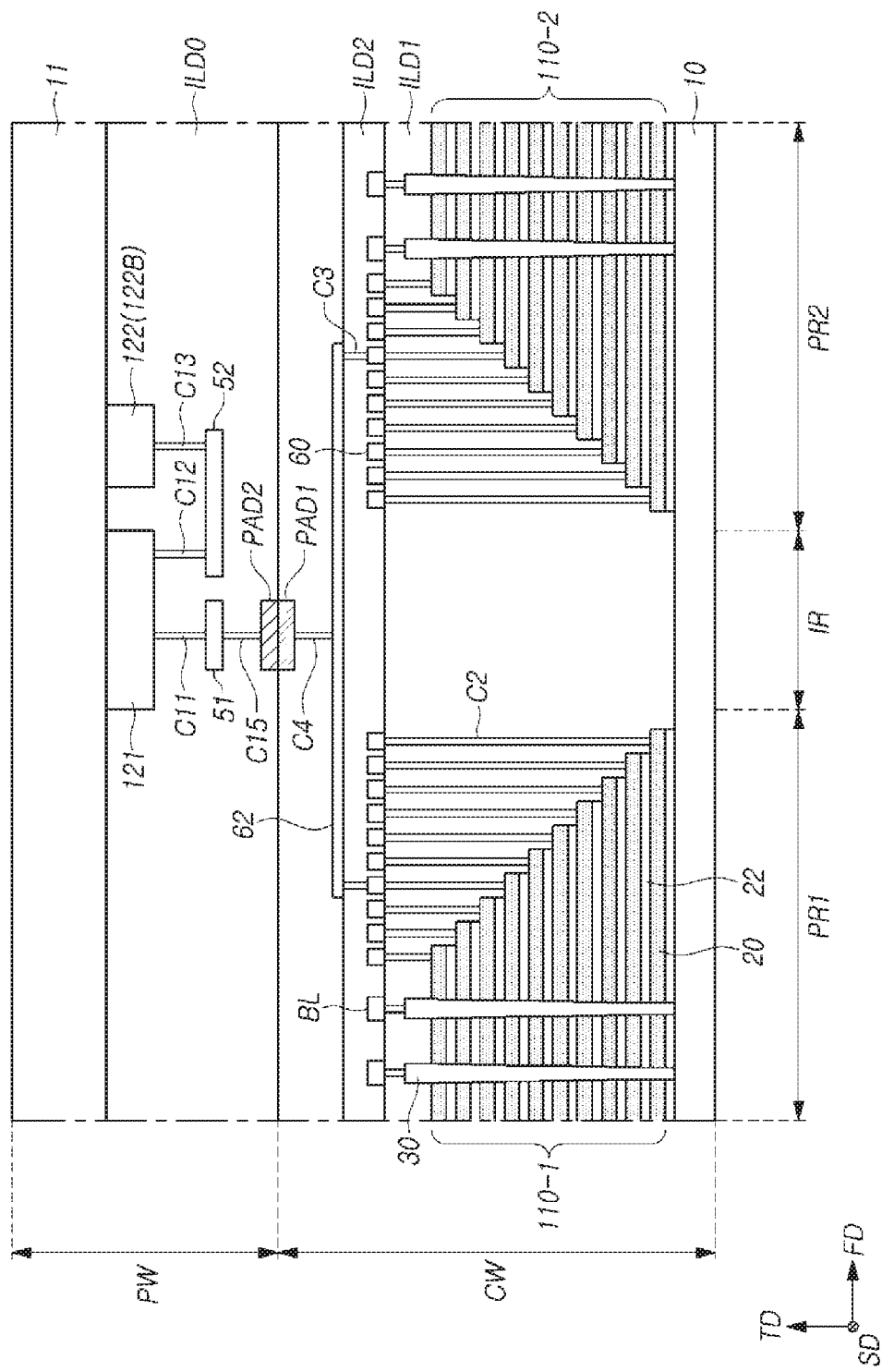
FIGS. 16 and 17 are cross-sectional views illustrating the semiconductor memory device in accordance with the embodiment.
Figure 17:
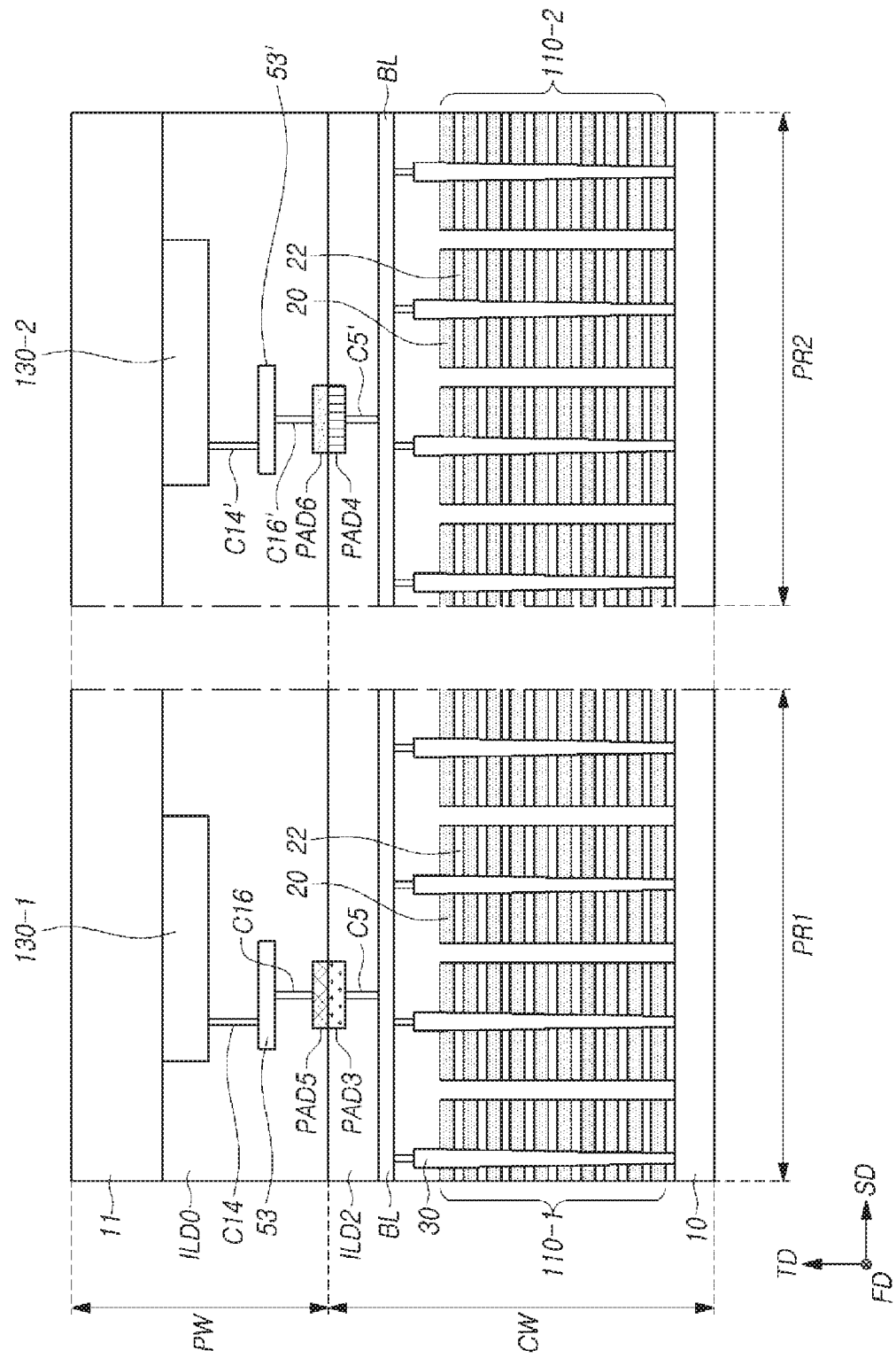

FIG. 15 is a perspective view schematically illustrating a representation of an example of a semiconductor memory device in accordance with an embodiment, and FIGS. 16 and 17 are cross-sectional views illustrating the semiconductor memory device in accordance with the embodiment.

Referring to FIG. 15, a semiconductor memory device 300 may have a POC (peri over cell) structure. The semiconductor memory device 300 may include a cell wafer CW and a peripheral wafer PW which is bonded onto the cell wafer CW. The cell wafer CW may include a base layer 10, and a first plane 110-1 and a second plane 110-2 which are defined on one surface of the base layer 10.

The peripheral wafer PW may include a substrate 11 and a peripheral circuit which is defined on one surface of the substrate 11. The peripheral circuit may include a pass transistor circuit 121, a block switch circuit 122, and first and second page buffer circuits 130-1 and 130-2. While not illustrated, the peripheral circuit may further include a voltage generator, an input/output buffer, and so forth. The disposition of the first plane 110-1 and the second plane 110-2 may be substantially the same as that disclosed in the embodiment described above with reference to FIG. 6. The disposition of the pass transistor circuit 121, the block switch circuit 122 and the first and second page buffer circuits 130-1 and 130-2 may be substantially the same as that disclosed in the embodiment described above with reference to FIGS. 6 and 7.

Referring to FIGS. 16 and 17, the cell wafer CW may include a plurality of pads PAD1, PAD3 and PAD4 on one surface thereof which is bonded to the peripheral wafer PW. The peripheral wafer PW may include a plurality of pads PAD2, PAD3 and PAD6 on one surface thereof which is bonded to the cell wafer CW.

Referring to FIG. 16, the first pad PAD1 of the cell wafer CW may be coupled in common to one of gate electrode layers 20 of the first plane 110-1 and one of gate electrode layers 20 of the second plane 110-2 through contacts C2, C3 and C4 and wiring lines 60 and 62. For example, one of the gate electrode layers 20 of the first plane 110-1 and one of the gate electrode layers 20 of the second plane 110-2 which are defined at the same layer may be coupled in common to the first pad PAD1. The second pad PAD2 of the peripheral wafer PW may be coupled to the pass transistor circuit 121 through contacts C11 and C15 and a wiring line 51. As the first pad PAD1 of the cell wafer CW and the second pad PAD2 of the peripheral wafer PW are bonded to each other, an electrical path that couples one of the gate electrode layers 20 of the first plane 110-1 and one of the gate electrode layers 20 of the second plane 110-2 to the pass transistor circuit 121 may be configured.

Referring to FIG. 17, the third pad PAD3 of the cell wafer CW may be coupled to a bit line BL of the first plane 110-1 through a contact C5. The fourth pad PAD4 of the cell wafer CW may be coupled to a bit line BL of the second plane 110-2 through a contact C5'. The fifth pad PAD5 of the peripheral wafer PW may be coupled to the first page buffer circuit 130-1 through contacts C14 and C16 and a wiring line 53. The sixth pad PAD6 of the peripheral wafer PW may be coupled to the second page buffer circuit 130-2 through contacts C14" and C16" and a wiring line 53'.

As the third pad PAD3 of the cell wafer CW and the fifth pad PAD5 of the peripheral wafer PW are bonded to each other, an electrical path that couples the bit line BL of the first plane 110-1 and the first page buffer circuit 130-1 may be configured. As the fourth pad PAD4 of the cell wafer CW and the sixth pad PAD6 of the peripheral wafer PW are bonded to each other, an electrical path that couples the bit line BL of the second plane 110-2 and the second page buffer circuit 130-2 may be configured.

Although FIGS. 16 and 17 illustrate each one of the first to sixth pads PAD1 to PAD6 for the sake of simplicity in illustration, each of the first to sixth pads PAD1 to PAD6 may be provided in a plural number. For example, each of the first pad PAD1 and the second pad PAD2 may be provided in a number equal to or greater than the number of the gate electrode layers 20 of the first plane 110-1 or the number of the gate electrode layers 20 of the second plane 110-2. Each of the third pad PAD3 and the fifth pad PAD5 may be provided in a number equal to or greater than the number of bit lines BL of the first plane 110-1. Each of the fourth pad PAD4 and the sixth pad PAD6 may be provided in a number equal to or greater than the number of bit lines BL of the second plane 110-2.

Figure 18:
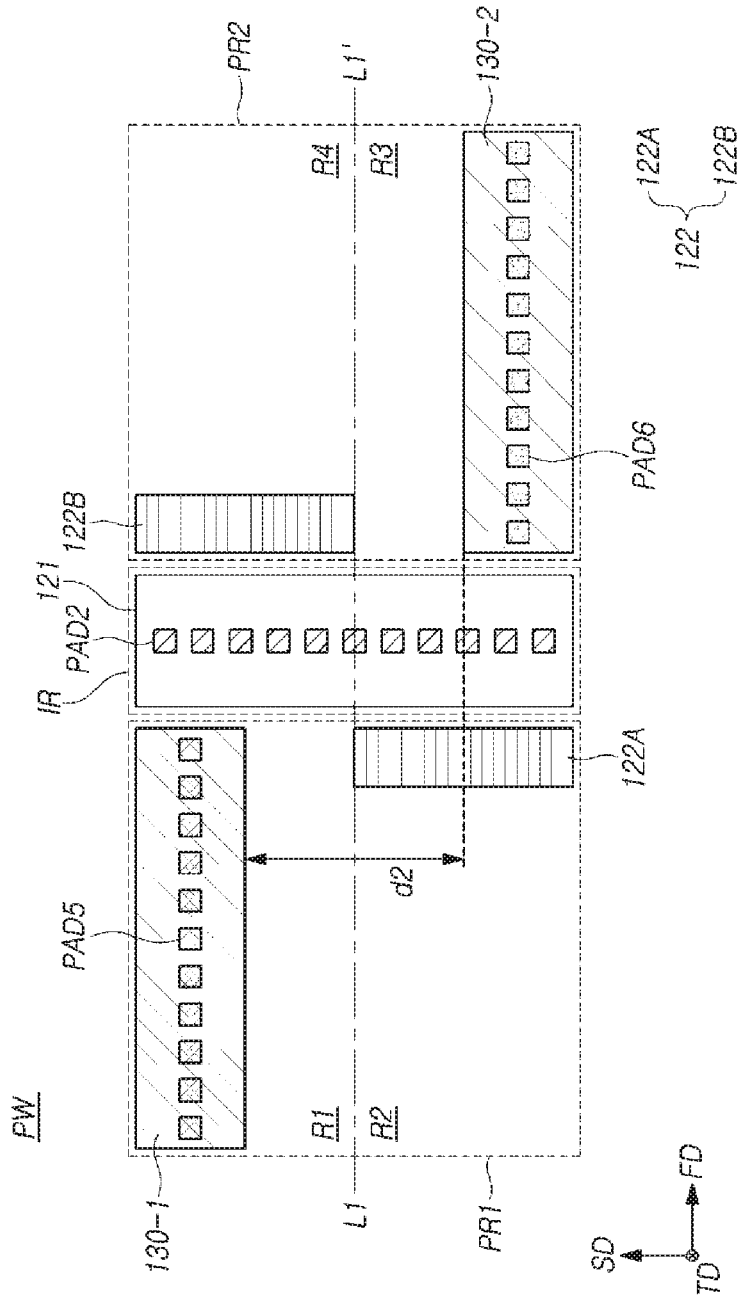
FIG. 18 is a top view schematically illustrating a representation of an example of the peripheral wafer illustrated in FIG. 15.
Figure 19:
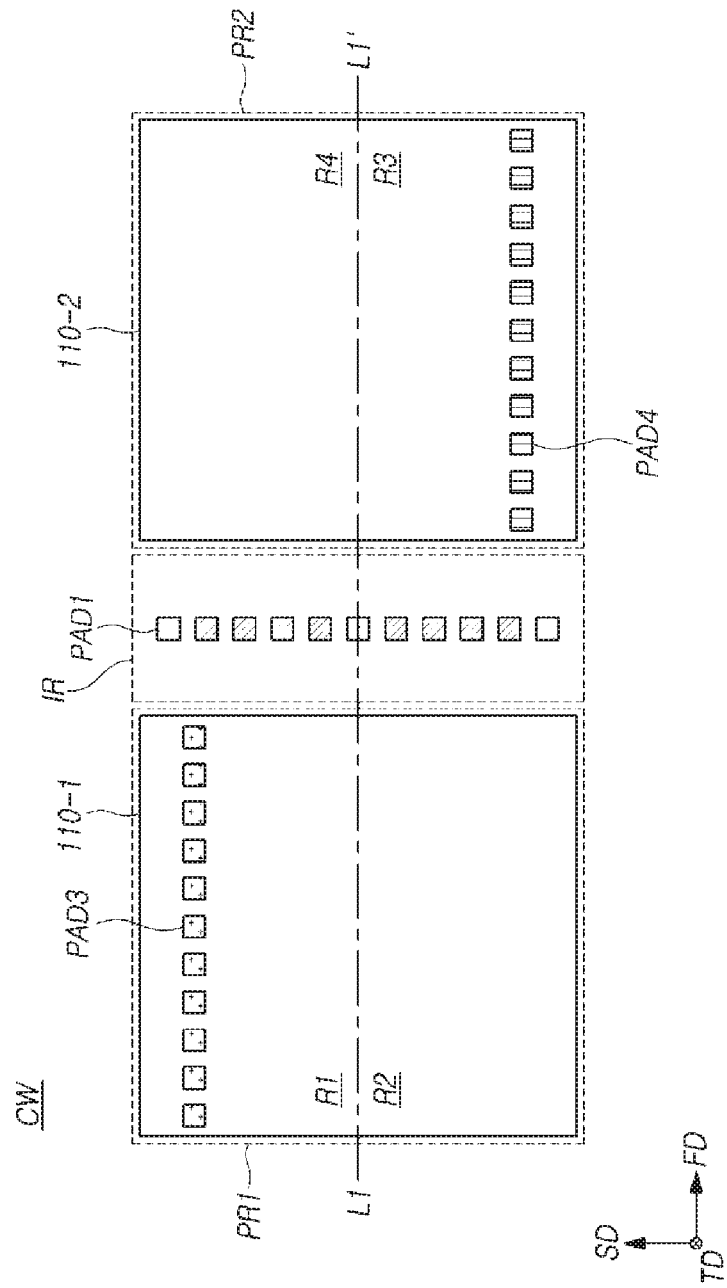
FIG. 19 is a top view schematically illustrating a representation of an example of the cell wafer illustrated in FIG. 15.
Figure 20:
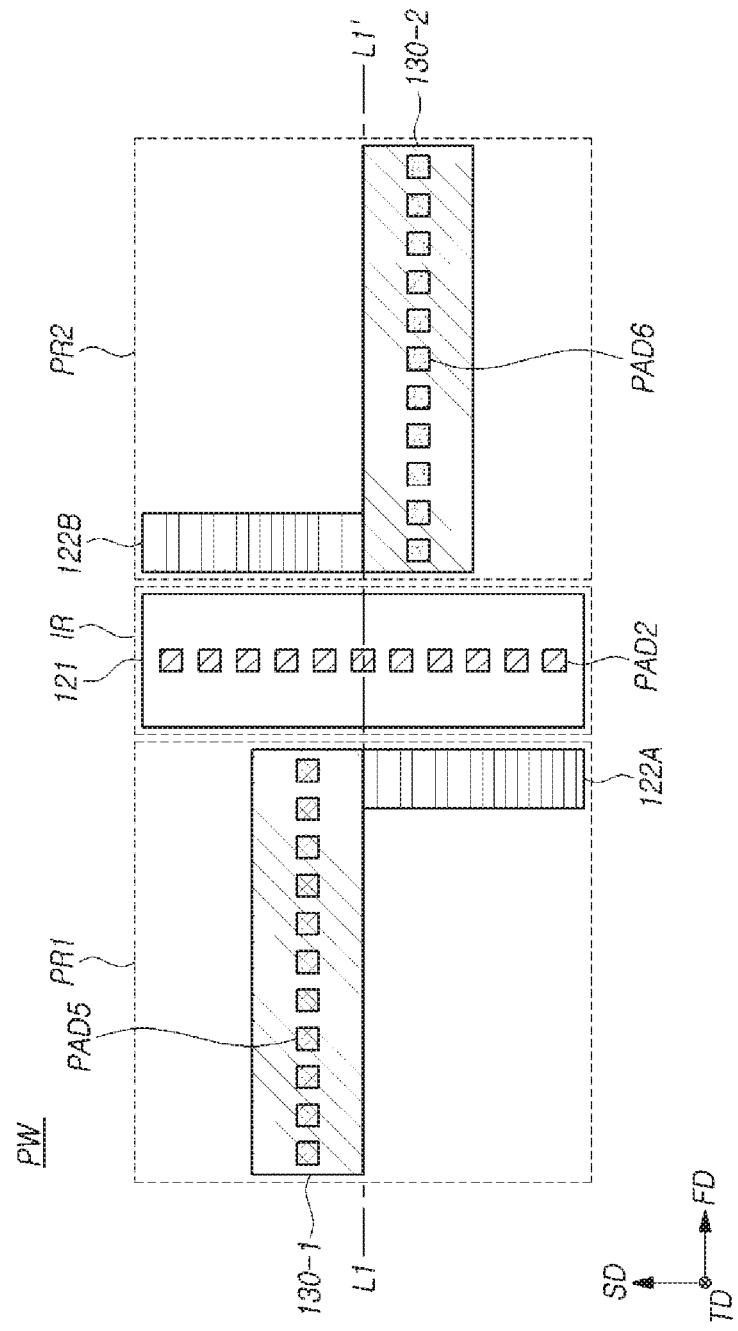
FIG. 20 is a top view schematically illustrating a representation of another example of the peripheral wafer illustrated in FIG. 15.
Figure 21:
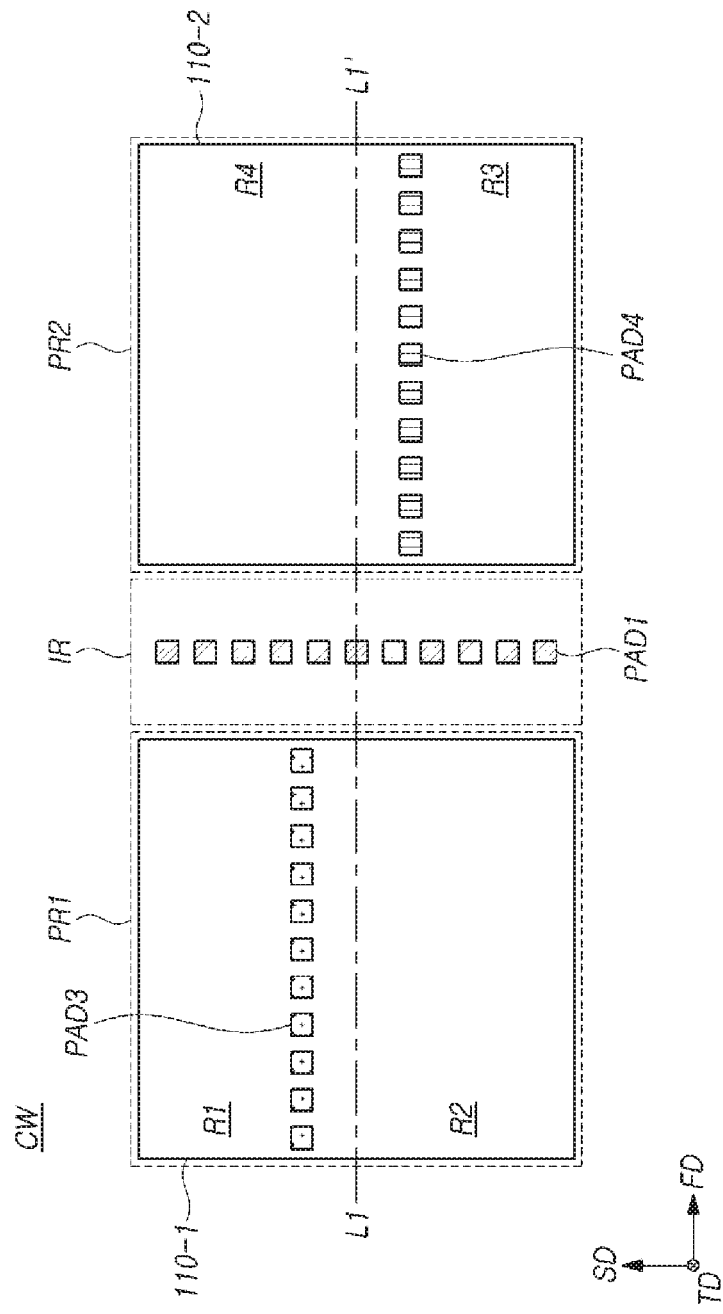
FIG. 21 is a top view schematically illustrating a representation of another example of the cell wafer illustrated in FIG. 15.

FIG. 18 is a top view schematically illustrating a representation of an example of the peripheral wafer illustrated in FIG. 15, FIG. 19 is a top view schematically illustrating a representation of an example of the cell wafer illustrated in FIG. 15, FIG. 20 is a top view schematically illustrating a representation of another example of the peripheral wafer illustrated in FIG. 15, and FIG. 21 is a top view schematically illustrating a representation of another example of the cell wafer illustrated in FIG. 15.

Referring to FIG. 18, a plurality of second pads PAD2, a plurality of fifth pads PAD5 and a plurality of sixth pads PAD6 may be defined on the one surface of the peripheral wafer PW. The second pads PAD2 may be disposed in an interval region IR. The second pads PAD2 may overlap with the pass transistor circuit 121 in the third direction TD. Such disposition of the second pads PAD2 may contribute to reducing or shortening the lengths of electrical paths that couple the pass transistor circuit 121 and the second pads PAD2.

The second pads PAD2 may be disposed in the second direction SD. Although the present embodiment illustrates a case where the second pads PAD2 are disposed in a line in the second direction SD, it is to be noted that the disclosure is not limited thereto. The disposition of the second pads PAD2 may be variously changed. For example, the second pads PAD2 may be disposed in a zigzag style.

The first page buffer circuit 130-1 and the second page buffer circuit 130-2 may be disposed to have a maximum separation distance in the second direction SD. In this case, the first page buffer circuit 130-1 and the second page buffer circuit 130-2 may be offset by a predetermined distance, for example, a second distance d2, in the second direction SD.

The plurality of fifth pads PAD5 may be disposed in a first region R1. The fifth pads PAD5 may overlap with the first page buffer circuit 130-1 in the third direction TD. The plurality of sixth pads PAD6 may be disposed in a third region R3. The sixth pads PAD6 may overlap with the second page buffer circuit 130-2 in the third direction TD. Such disposition of the fifth and sixth pads PAD5 and PAD6 may contribute to reducing or shortening the lengths of electrical paths that couple the first page buffer circuit 130-1 and the fifth pads PAD5 and the lengths of electrical paths that couple the second page buffer circuit 130-2 and the sixth pads PAD6.

The fifth pads PAD5 may be disposed in the first direction FD. The sixth pads PAD6 may also be disposed in the first direction FD. Although the present embodiment illustrates a case where the fifth pads PAD5 are disposed in a line in the first direction FD and the sixth pads PAD6 are disposed in a line in the first direction FD, it is to be noted that the disclosure is not limited thereto. The disposition of the fifth and sixth pads PAD5 and PAD6 may be variously changed.

Referring to FIG. 19, a plurality of first pads PAD1, a plurality of third pads PAD3 and a plurality of fourth pads PAD4 may be disposed on the one surface of the cell wafer CW.

The first pads PAD1 may be disposed to face the second pads PAD2 (see FIG. 18) of the peripheral wafer PW (see FIG. 18). In correspondence to the second pads PAD2 disposed in the interval region IR, the first pads PAD1 may be disposed in the interval region IR. The first pads PAD1 may overlap with the pass transistor circuit 121 (see FIG. 18) in the third direction TD. In correspondence to the arrangement structure of the second pads PAD2 disposed in the second direction SD, the first pads PAD1 may also be disposed in the second direction SD.

The third pads PAD3 may be disposed to face the fifth pads PAD5 (see FIG. 18) of the peripheral wafer PW (see FIG. 18). In correspondence to the fifth pads PAD5 disposed in the first region R1, the third pads PAD3 may be disposed in the first region R1. The third pads PAD3 may overlap with the first page buffer circuit 130-1 (see FIG. 18) in the third direction TD. In correspondence to the arrangement structure of the fifth pads PAD5 disposed in the first direction FD, the third pads PAD3 may also be disposed in the first direction FD.

The fourth pads PAD4 may be disposed to face the sixth pads PAD6 (see FIG. 18) of the peripheral wafer PW (see FIG. 18). In correspondence to the sixth pads PAD6 disposed in the third region R3, the fourth pads PAD4 may be disposed in the third region R3. The fourth pads PAD4 may overlap with the second page buffer circuit 130-2 (see FIG. 18) in the third direction TD. In correspondence to the arrangement structure of the sixth pads PAD6 disposed in the first direction FD, the fourth pads PAD4 may also be disposed in the first direction FD.

Referring to FIGS. 20 and 21, the first page buffer circuit 130-1 and the second page buffer circuit 130-2 may be disposed to have a minimum separation distance in the second direction SD. In this case, one side of the first page buffer circuit 130-1 and one side of the second page buffer circuit 130-2 may be aligned in the first direction FD.

According to some embodiments of the disclosure, since two planes are disposed to share one row decoder, the number of pads which couple the row decoder and the planes may be reduced. Accordingly, it is possible to increase a pitch of the pads, and thus, it is possible to suppress a coupling failure from occurring between the pads during a chip bonding process.

Figure 22:
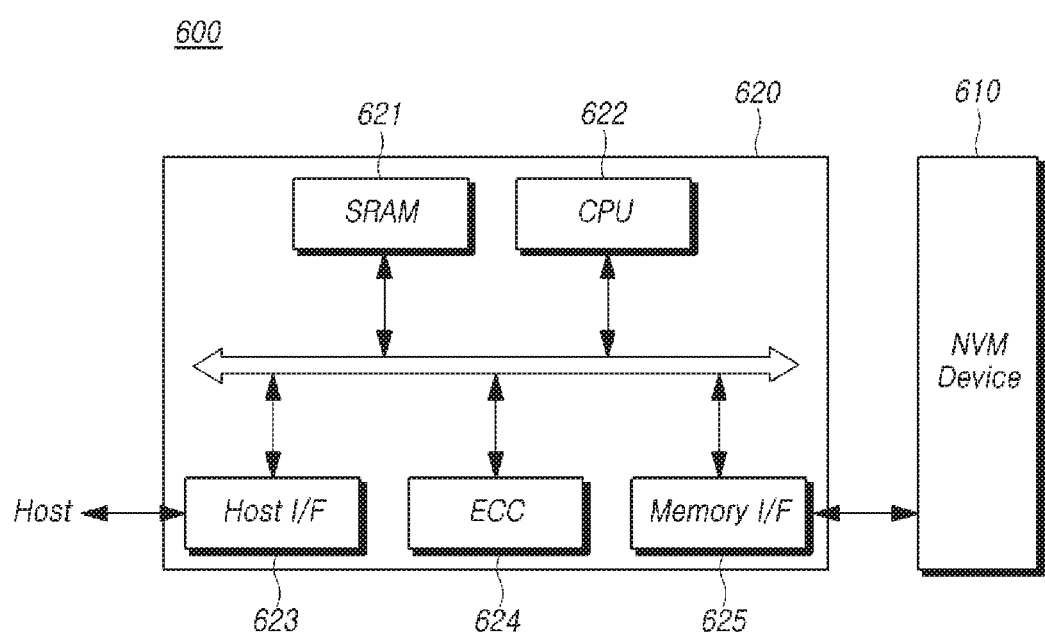
FIG. 22 is a block diagram schematically illustrating an example of a memory system including a semiconductor memory device in accordance with an embodiment.

FIG. 22 is a simplified block diagram schematically illustrating a memory system including a memory device according to an embodiment of the present invention.

Referring to FIG. 22, the memory system 600 may include the semiconductor memory device 610 and a memory controller 620.

The semiconductor memory device 610 may be comprised the memory device according to an embodiment of the invention as described above, and may be operated in the manner described above. The memory controller 620 may control the semiconductor memory device 610. For example, the combination of the semiconductor memory device 610 and the memory controller 620, may be configured as a memory card or a solid state disk (SSD). The memory controller 620 may include an SRAM 621, a central processing unit (CPU) 622, a host interface 623, an ECC block 624, a memory interface 625.

The SRAM 621 may be used as the working memory of the CPU 622. The host interface 623 may include the data exchange protocol of a host which may be coupled with the memory system 600.

The ECC block 624 may detect and correct an error included in the data read out from the semiconductor memory device 610.

The memory interface 625 may interface with the semiconductor memory device 610. The CPU 622 may perform general control operations for data exchange of the memory controller 620.

Although not shown, it should become apparent to a person skilled in the art that the memory system 600 may further be provided with a ROM which stores code data for interfacing with the host. The semiconductor memory device 610 may be provided as a multi-chip package constructed by a plurality of flash memory chips.

The memory system 600 may be used as a storage medium of high reliability having a low probability of an error occurring. The aforementioned nonvolatile memory device may be provided for a memory system such as a solid state disk (SSD). The memory controller 620 may communicate with an external device (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (integrated device electronics) protocol and the like.

Figure 23:
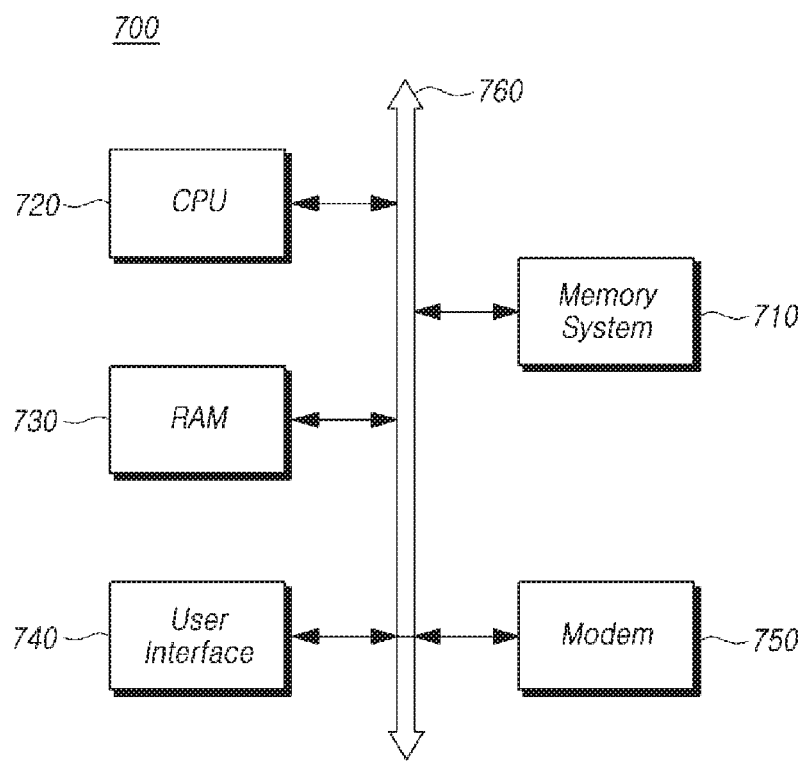
FIG. 23 is a block diagram schematically illustrating an example of a computing system including a semiconductor memory device in accordance with an embodiment.

FIG. 23 is a simplified block diagram schematically illustrating a computing system including a memory device, according to an embodiment of the present invention.

Referring to FIG. 23, a computing system 700 according to an embodiment may include a memory system 710, a microprocessor (or CPU) 720, a RAM 730, a user interface 740, a modem 750 such as a baseband chipset, and, which are electrically coupled to a system bus 760. In an embodiment, the computing system 700 may be a mobile device, in which case a battery (not shown) for supplying the operating voltage of the computing system 700 may be additionally provided. Although not shown in the drawing, it should become apparent to a person skilled in the art that the computing system 700 may further comprise an application chipset, a COMS image sensor (CIS), a mobile DRAM, and so on. The memory system 710 may be configured, for example, as an SSD (solid state drive/disk) which uses a nonvolatile memory to store data. Also as an example, the memory system 710 may be provided as a fusion flash memory (for example, a NAND or a NOR flash memory).

It is not that the above-described embodiments are realized only by a device and a method, and they may be realized also by a program which performs a function corresponding to the configuration of each embodiment or a recording medium on which the program is recorded. Such realization may be easily derived from the descriptions of the above-described embodiments by a person skilled in the art to which the embodiments pertain.

Although various embodiments have been described for illustrative purposes, it will be apparent to those skilled in the art that various changes and modifications may be made without departing from the spirit and scope of the invention as defined in the following claims.

What is claimed is:

1. A semiconductor memory device comprising:
a cell wafer including first and second planes which are disposed to be adjacent to each other in a first direction and each include a plurality of memory cells, and having, on one surface thereof, a first pad which is coupled in common to the first plane and the second plane; and
a peripheral wafer including a peripheral circuit, and having, on one surface thereof bonded to the one surface of the cell wafer, a second pad which is coupled with the peripheral circuit and is bonded to the first pad,
wherein the peripheral circuit includes a pass transistor circuit which is coupled with the second pad and a block switch circuit which controls the pass transistor circuit,
wherein the block switch circuit is disposed in a first plane region of the peripheral wafer, which overlaps with the first plane in a vertical direction orthogonal to the one surface, and a second plane region of the peripheral wafer, which overlaps with the second plane in the vertical direction, and
wherein the pass transistor circuit is disposed in an interval region of the peripheral wafer between the first plane region and the second plane region.

2. The semiconductor memory device according to claim 1, wherein the block switch circuit is disposed adjacent to the interval region.

3. The semiconductor memory device according to claim 1, wherein the first pad and the second pad are disposed in the interval region.

4. The semiconductor memory device according to claim 1, wherein the first pad and the second pad overlap with the pass transistor circuit in the vertical direction.

5. The semiconductor memory device according to claim 1,
wherein the cell wafer includes, on the one surface thereof, a third pad which is coupled to the first plane and a fourth pad which is coupled to the second plane,
wherein the peripheral wafer includes, on the one surface thereof, a fifth pad which is bonded to the third pad and a sixth pad which is bonded to the fourth pad, and
wherein the peripheral circuit further includes a first page buffer circuit which is coupled with the fifth pad and is disposed in the first plane region and a second page buffer circuit which is coupled with the sixth pad and is disposed in the second plane region.

6. The semiconductor memory device according to claim 5,
wherein the first plane region includes a first region and a second region which are divided by a first virtual line extending in the first direction, and the second plane region includes a third region and a fourth region which are divided by the first virtual line,
wherein the first page buffer circuit is disposed in the first region,
wherein the second page buffer circuit is disposed in the third region, and
wherein the block switch circuit includes first and second sub block switch circuits which are disposed in the second and fourth regions, respectively.

7. The semiconductor memory device according to claim 6, wherein the first and fourth regions are disposed to be adjacent to each other in the first direction, and the second and third regions are disposed to be adjacent to each other in the first direction.

8. The semiconductor memory device according to claim 6, wherein the first sub block switch circuit is disposed to have the same length as the second region in a second direction that is parallel to the one surface and intersects with the first direction, and the second sub block switch circuit is disposed to have the same length as the fourth region in the second direction.

9. The semiconductor memory device according to claim 6, wherein the first and second page buffer circuits are disposed to have shapes which extend in the first direction.

10. The semiconductor memory device according to claim 6, wherein the third pad and the fifth pad are disposed in the first region, and the fourth pad and the sixth pad are disposed in the third region.

11. The semiconductor memory device according to claim 5, wherein the third pad and the fifth pad overlap with the first page buffer circuit in the vertical direction, and the fourth pad and the sixth pad overlap with the second page buffer circuit in the vertical direction.

12. The semiconductor memory device according to claim 1,
wherein each of the first and second planes comprises:
a base layer;
a plurality of gate electrode layers and a plurality of dielectric layers alternately stacked over the base layer; and
channel structures passing through the plurality of gate electrode layers and the plurality of dielectric layers in the vertical direction, and
wherein each of the first and second planes has a step structure which exposes the gate electrode layers, at an edge adjacent to the interval region.

13. A semiconductor memory device comprising:
a cell wafer including a first plane and a second plane which are disposed to be adjacent to each other in a first direction and each include a plurality of memory cells; and
a peripheral wafer including a row decoder which simultaneously controls the first and second planes and first and second page buffer circuits which control the first and second planes, respectively,
wherein the cell wafer includes, on one surface thereof bonded to the peripheral wafer, a first pad which is coupled in common with the first plane and the second plane, and the peripheral wafer includes, on one surface thereof bonded to the cell wafer, a second pad which is coupled with the row decoder and is bonded to the first pad.

14. The semiconductor memory device according to claim 13,
wherein the row decoder includes a pass transistor circuit which is coupled with the second pad and a block switch circuit which controls the pass transistor circuit,
wherein the block switch circuit is disposed in a first plane region of the peripheral wafer, which overlaps with the first plane in a vertical direction orthogonal to the one surface, and a second plane region of the peripheral wafer, which overlaps with the second plane in the vertical direction, and
wherein the pass transistor circuit is disposed in an interval region of the peripheral wafer between the first plane region and the second plane region.

15. The semiconductor memory device according to claim 14, wherein the first pad and the second pad are disposed in the interval region.

16. The semiconductor memory device according to claim 14, wherein the first pad and the second pad overlap with the pass transistor circuit in the vertical direction.

17. The semiconductor memory device according to claim 14,
wherein the cell wafer includes, on the one surface thereof, a third pad which is coupled to the first plane and a fourth pad which is coupled to the second plane, and
wherein the peripheral wafer includes, on the one surface thereof, a fifth pad which is coupled with the first page buffer circuit and is bonded to the third pad and a sixth pad which is coupled with the second page buffer circuit and is bonded to the fourth pad.

18. The semiconductor memory device according to claim 17,
wherein the first plane region includes a first region and a second region which are divided by a first virtual line extending in the first direction, and the second plane region includes a third region and a fourth region which are divided by the first virtual line,
wherein the first page buffer circuit is disposed in the first region,
wherein the second page buffer circuit is disposed in the third region, and
wherein the block switch circuit includes first and second sub block switch circuits which are disposed in the second and fourth regions, respectively.

19. The semiconductor memory device according to claim 18, wherein the third pad and the fifth pad are disposed in the first region, and the fourth pad and the sixth pad are disposed in the third region.

20. The semiconductor memory device according to claim 18, wherein the third pad and the fifth pad overlap with the first page buffer circuit in the vertical direction, and the fourth pad and the sixth pad overlap with the second page buffer circuit in the vertical direction.

\* \* \* \* \*